US009099590B2

(12) United States Patent
Taira et al.

(10) Patent No.: US 9,099,590 B2
(45) Date of Patent: Aug. 4, 2015

(54) SOLAR CELL AND SOLAR CELL MODULE

(75) Inventors: Shigeharu Taira, Amagasaki (JP);
Yukihiro Yoshimine, Kobe (JP);
Yousuke Ishii, Izumiotsu (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 13/201,882

(22) PCT Filed: Feb. 15, 2010

(86) PCT No.: PCT/JP2010/052157
§ 371 (c)(1),
(2), (4) Date: Oct. 26, 2011

(87) PCT Pub. No.: WO2010/095583
PCT Pub. Date: Aug. 26, 2010

(65) Prior Publication Data
US 2012/0031457 A1 Feb. 9, 2012

(30) Foreign Application Priority Data

Feb. 17, 2009 (JP) .................................. 2009-034653
Aug. 26, 2009 (JP) .................................. 2009-195376

(51) Int. Cl.
*H02N 6/00* (2006.01)
*H01L 31/042* (2014.01)
*H01L 31/05* (2014.01)
*H01L 31/0224* (2006.01)

(52) U.S. Cl.
CPC .... *H01L 31/0508* (2013.01); *H01L 31/022433* (2013.01); *Y02E 10/50* (2013.01)

(58) Field of Classification Search
CPC .................. H01L 31/022433; H01L 31/0508
USPC ................................................. 136/244, 256
See application file for complete search history.

(56) References Cited

U.S. PATENT DOCUMENTS

| 5,110,370 | A | * | 5/1992 | Vogeli et al. | 136/256 |
| 6,350,946 | B1 | * | 2/2002 | Miyake et al. | 136/252 |
| 2001/0011552 | A1 | * | 8/2001 | Morizane et al. | 136/251 |
| 2007/0095387 | A1 | * | 5/2007 | Fujii et al. | 136/251 |
| 2007/0295381 | A1 | * | 12/2007 | Fujii et al. | 136/244 |
| 2008/0121265 | A1 | * | 5/2008 | Hishida et al. | 136/244 |
| 2008/0128019 | A1 | * | 6/2008 | Lopatin et al. | 136/252 |
| 2009/0025782 | A1 | * | 1/2009 | Ojima et al. | 136/255 |
| 2009/0038675 | A1 | * | 2/2009 | Tsunomura et al. | 136/251 |
| 2010/0126551 | A1 | | 5/2010 | Okamoto et al. | |
| 2011/0011454 | A1 | * | 1/2011 | Taira | 136/256 |

FOREIGN PATENT DOCUMENTS

| CN | 1825630 A | | 8/2006 |
| JP | 06151907 A | * | 5/1994 |
| JP | 2007-214533 A | | 8/2007 |

(Continued)

*Primary Examiner* — Eli Mekhlin
(74) *Attorney, Agent, or Firm* — Marvin A. Motsenbocker; Mots Law, PLLC

(57) ABSTRACT

A solar cell (10) provided with connecting wires (351) which are connected to light receiving surface side fine-line electrodes (30A). The connecting wires (351) have expanding portions (BP1, BP2) which expand from the connection region (R1) where wiring member is to be connected. The expanding portions (BP1, BP2) expand in an orthogonal direction orthogonal to the longitudinal direction of the wiring material in a state where the wiring member is connected to the connecting wires (351).

23 Claims, 24 Drawing Sheets

(56) References Cited

FOREIGN PATENT DOCUMENTS

| JP | 2008-135652 A | 6/2008 |
| JP | 2008159798 A * | 7/2008 |
| WO | WO2008-023795 A1 | 2/2008 |
| WO | 2009099179 A1 | 8/2009 |
| WO | WO 2009099179 A1 * | 8/2009 |

* cited by examiner

FIG. 9
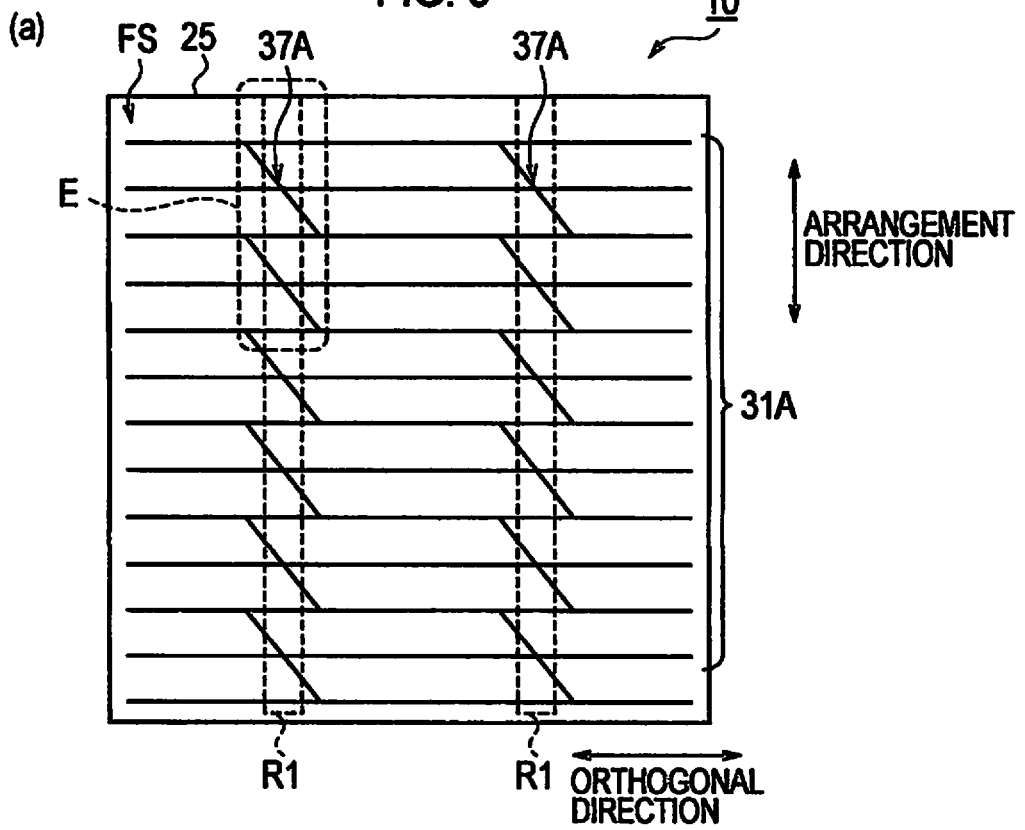
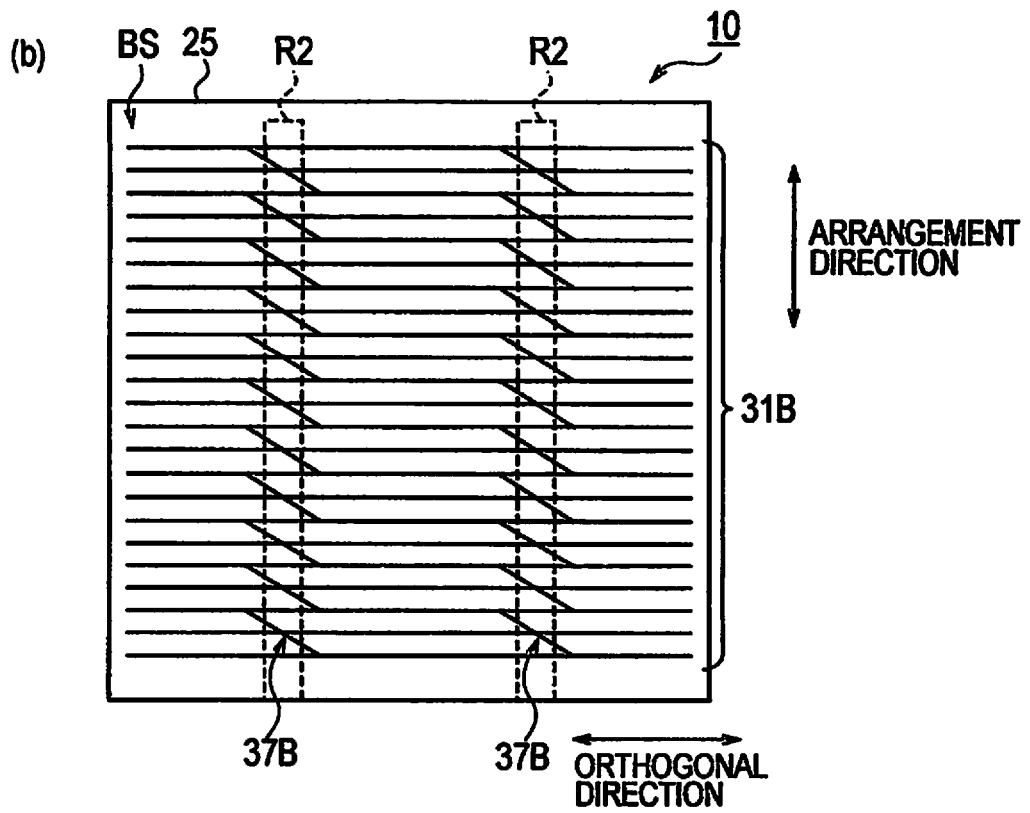

FIG. 10
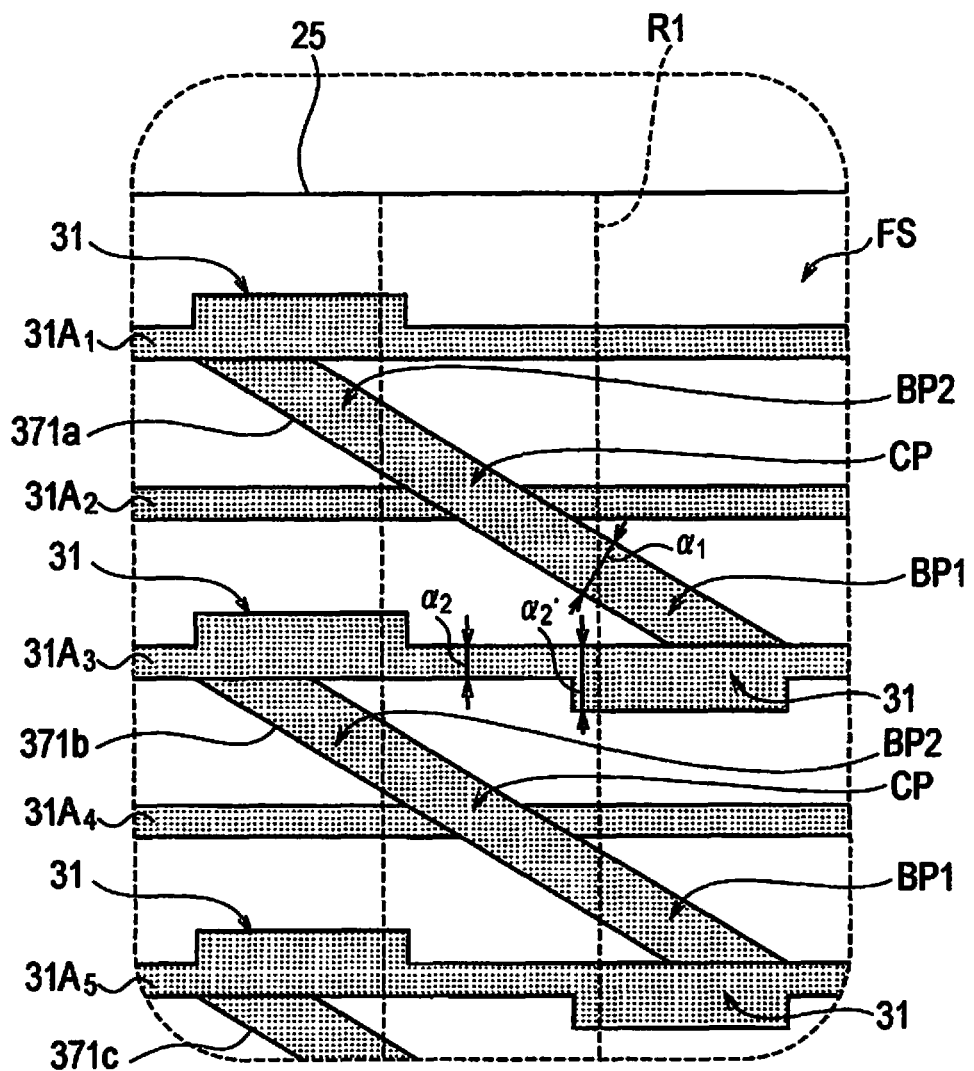
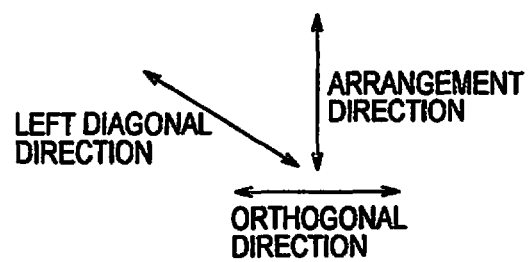

FIG. 15
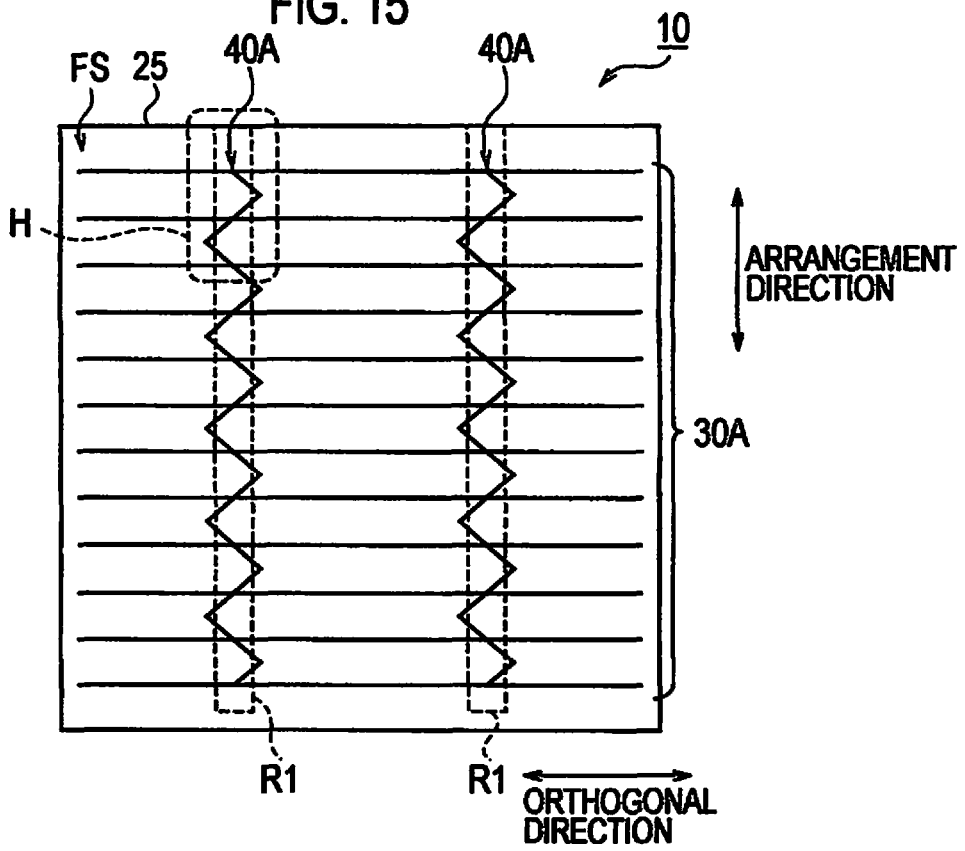
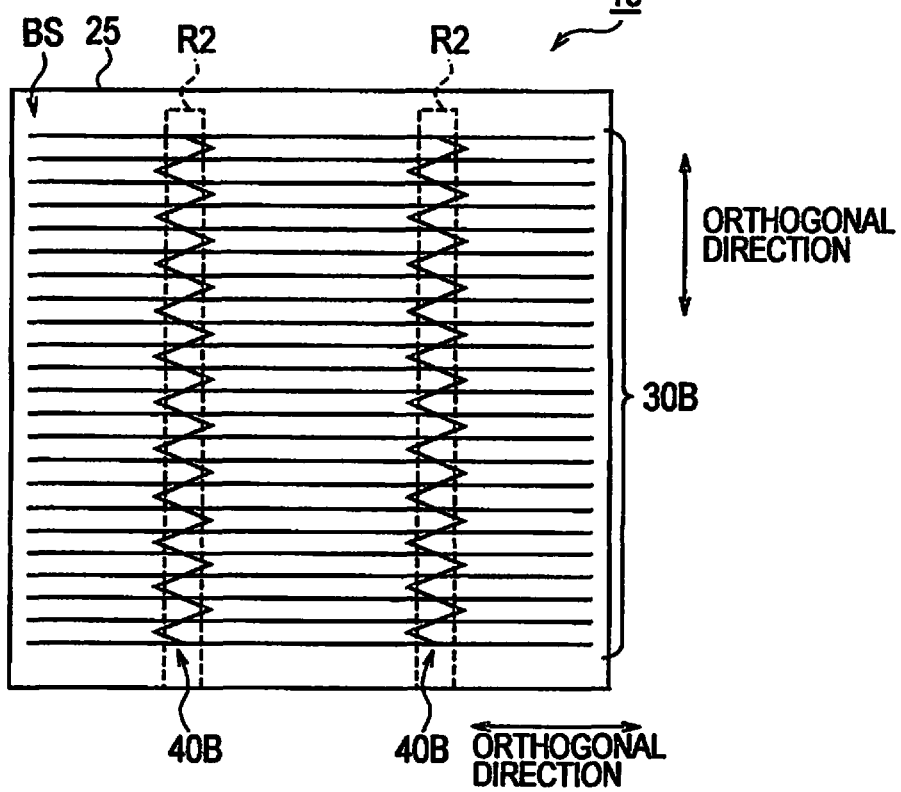

FIG. 21
(a) 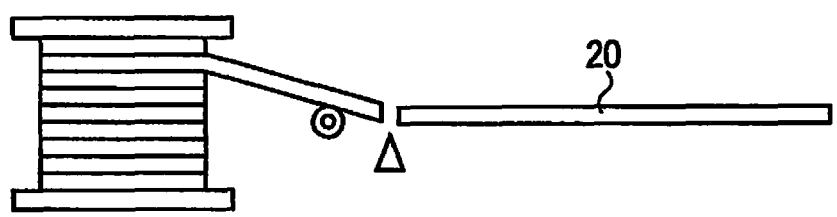
(b) 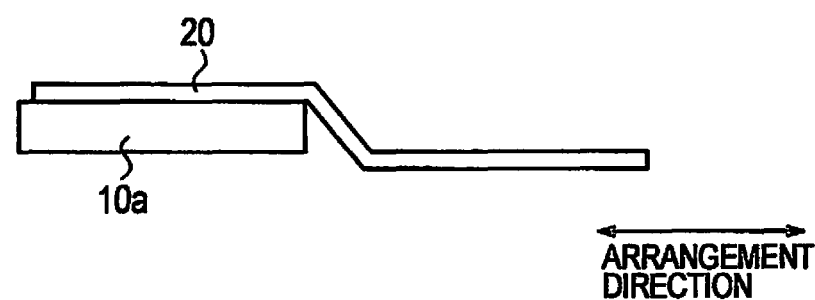
↔ ARRANGEMENT DIRECTION
(c) 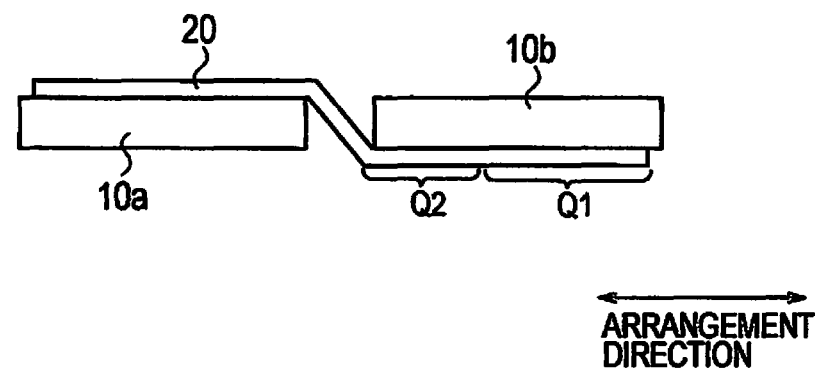
↔ ARRANGEMENT DIRECTION FIG. 22
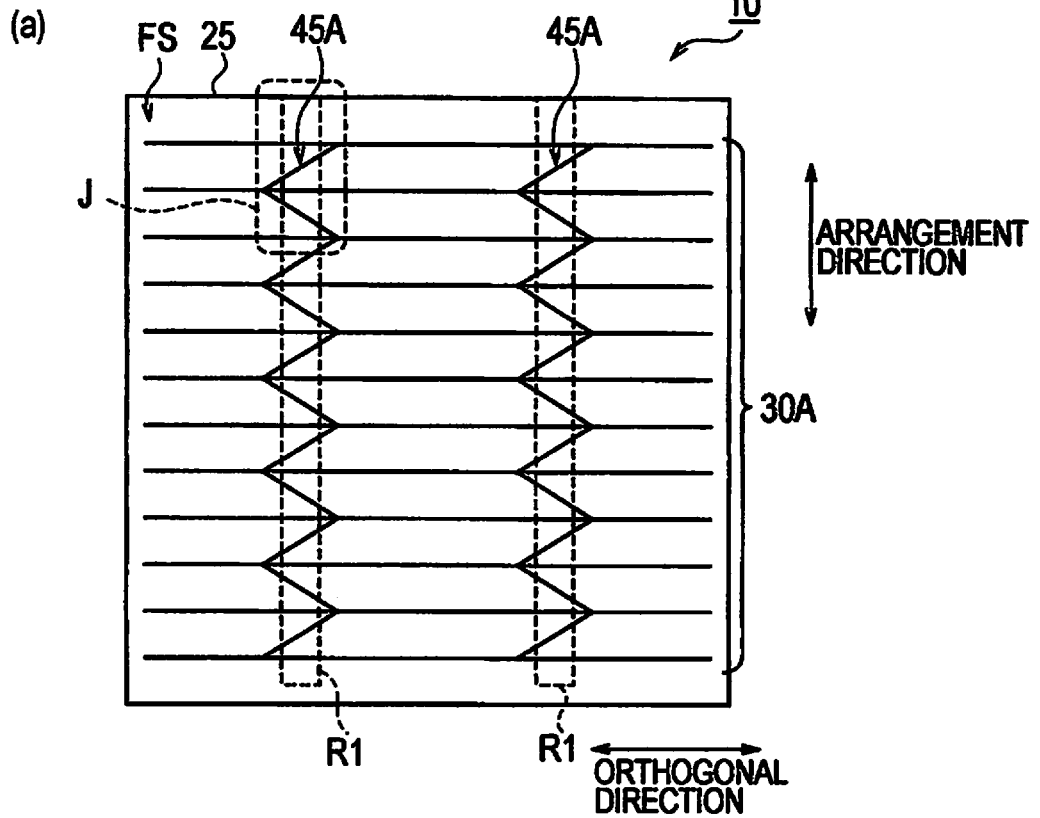
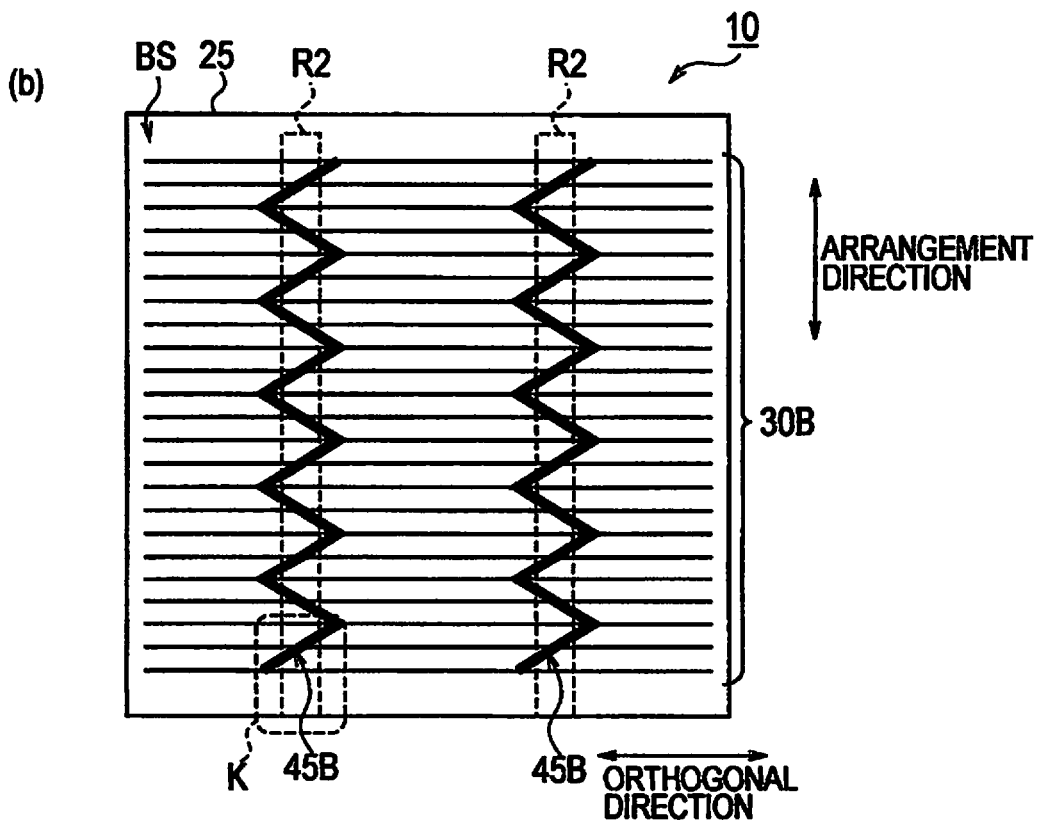

FIG. 27
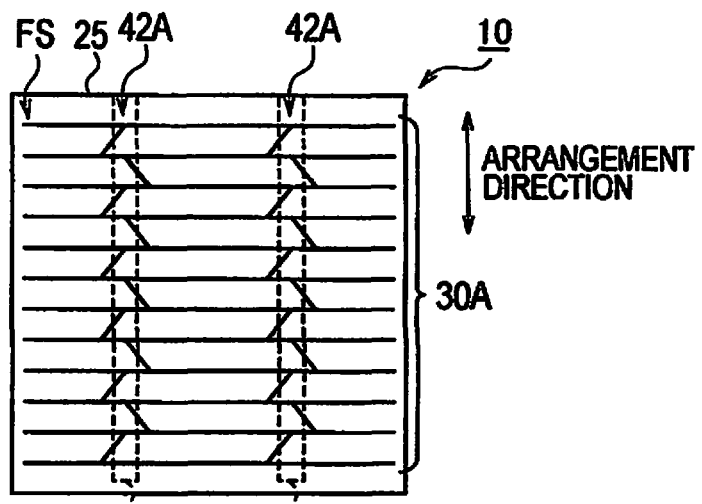
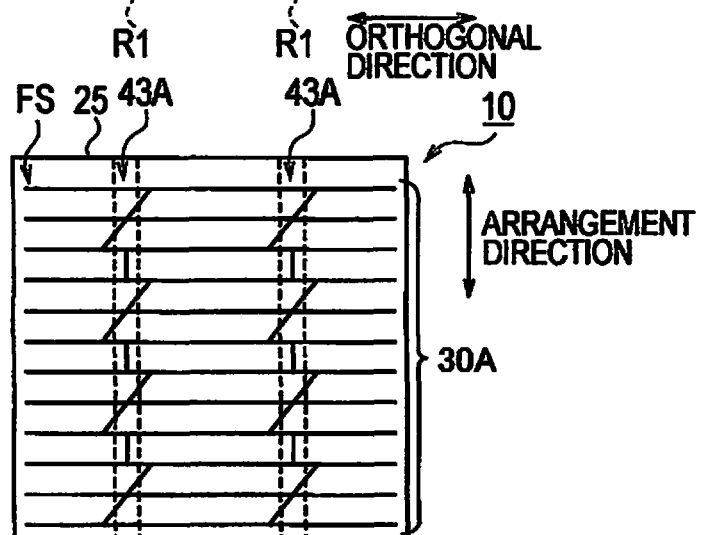
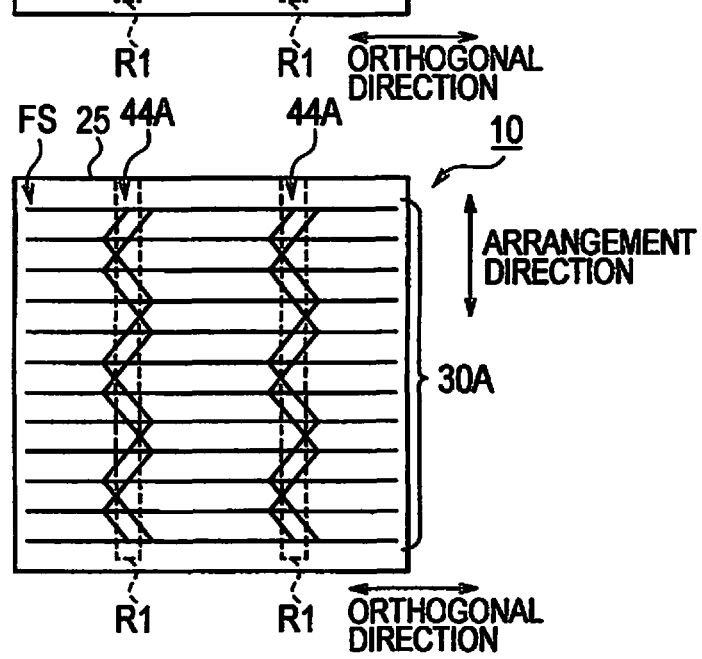

SOLAR CELL AND SOLAR CELL MODULE

TECHNICAL FIELD

The present invention relates to a solar cell to which a wiring member is connected and a solar cell module.

BACKGROUND ART

Solar cells can directly convert clean and unlimitedly-supplied sunlight energy into electric energy, and thus are expected as new energy source.

In general, output power per solar cell is about several watts. Accordingly, when solar cells are used as power source for houses, buildings, or the like, a solar cell module is used whose output power is increased by connecting a plurality of solar cells to each other through wiring members (tabs).

In a solar cell, a plurality of fine-line electrodes (finger electrodes) for collecting carriers and connection electrodes (bus bar electrodes) to which wiring members are to be connected are generally provided on a photoelectric conversion body. The wiring members are soldered on the connection electrodes. The fine-line electrodes and the connection electrodes are formed of a thermosetting or sintering type conductive paste.

In this regard, patent literature 1 proposes a technique for bonding a wiring member onto a connection electrode by using a resin adhesive bondable at a temperature lower than a soldering temperature. This technique can decrease the expansion and contraction of the wiring member, which are caused by heat generated when connection is made. Thus, a solar cell can be prevented from warping.

In addition, patent literature 2 proposes a technique for disposing a wiring member on a connection electrode narrower than the wiring member by using the above-described resin adhesive. This technique allows formation of the connection electrode in a thin line shape, so that the cost of manufacturing a solar cell module can be reduced.

PRIOR ART DOCUMENTS

Patent Document

PATENT DOCUMENT 1: Japanese Patent Application Publication No. 2007-214533
PATENT DOCUMENT 2: International Patent Publication No. WO2008/023795

SUMMARY OF THE INVENTION

However, the technique described in patent literature 1 may still cause a warp in a solar cell because the photoelectric conversion body and the connection electrode have different wire expansion coefficients.

On the other hand, in the technique described in patent literature 2, the connection electrode is formed to have a significantly narrower width (approximately 0.3 mm) than the wiring member. Since a certain level of tolerance is allowed for solar cell module manufacturing equipment, the wiring member is sometimes disposed in a position off-centered of the connection electrode in the process of connecting the wiring member to the connection electrode. In this case, shearing stress is applied to the photoelectric conversion body through the connection electrode, which causes a defect such as a crack of the photoelectric conversion body. As a result, the characteristic of a solar cell may be deteriorated.

Moreover, in order to improve the positional accuracy required to connect a wiring member to a connection electrode, a position determination device for a connection electrode and a positioning device for a wiring member have to be provided with higher accuracy. This results in an increase in the cost of manufacturing a solar cell module.

The present invention has been made in view of the above-described circumstances. An objective of the present invention is to provide a solar cell and a solar cell module that are prevented from having characteristic deterioration, which may be caused by a defect such as a crack of a photoelectric conversion body, without causing an increase in the manufacturing cost thereof.

A solar cell according to a feature of the present invention, is connected to another solar cell through a wiring member, and includes: a photoelectric conversion body; a plurality of fine-line electrodes formed on a main surface of the photoelectric conversion body; and a connecting wire group formed on the main surface of the photoelectric conversion body and connected to the fine-line electrode, wherein the connecting wire group has an expanding portion expanding from a connection region in the main surface to which the wiring member is to be connected, and the expanding portion expands in an orthogonal direction orthogonal to a longitudinal direction of the wiring member in a state where the wiring member is connected to the connecting wire group.

In the solar cell according to the feature of the present invention, the expanding portion may be electrically connected to at least one of the plurality of fine-line electrodes.

In the solar cell according to the feature of the present invention, the connecting wire group may have a plurality of the expanding portions, and the plurality of expanding portions may be dispersed in a longitudinal direction of the connection region.

In the solar cell according to the feature of the present invention, the expanding portion may expand from one side of the connection region, and the connecting wire group may have another expanding portion expanding from the other side of the connection region.

In the solar cell according to the feature of the present invention, a formation width of the connecting wire group in the orthogonal direction may be wider than a line width of the wiring member in the orthogonal direction.

In the solar cell according to the feature of the present invention, the plurality of fine-line electrodes may be electrically connected to each other through the connecting wire group.

In the solar cell according to the feature of the present invention, the connecting wire group may include a plurality of connecting wires, each being electrically connected to at least one of the plurality of fine-line electrodes, and each of the plurality of connecting wires may have the expanding portion.

In the solar cell according to the feature of the present invention, the connecting wire group may include a first connecting wire group formed on the main surface of the photoelectric conversion body, and a second connecting wire group formed on a main surface of the photoelectric conversion body positioned on an opposite side from the main surface, a formation region of the first connecting wire group may be included in a formation region of the second connecting wire group in a plan view of the photoelectric conversion body, and a width of a second connecting wire forming the second connecting wire group may be wider than a width of a first connecting wire forming the first connecting wire group.

In the solar cell according to the feature of the present invention, the first connecting wire group may be formed on a light-receiving surface of the photoelectric conversion body, the light-receiving surface mainly receiving light, and the second connecting wire group may be formed on a back surface of the photoelectric conversion body, the back surface receiving a less amount of light than the light-receiving surface.

In the solar cell according to the feature of the present invention, a height of the first connecting wire in a thickness direction of the solar cell may be higher than a height of the second connecting wire.

A solar cell module according to a feature of the present invention, is sealed between a light-receiving surface side protection member and a back surface side protection member and including a solar cell to which a wiring member is connected, wherein the solar cell includes: a photoelectric conversion body; a plurality of fine-line electrodes formed on a main surface of the photoelectric conversion body; and a connecting wire group formed on the main surface of the photoelectric conversion body and connected to the fine-line electrode, the connecting wire group has an expanding portion expanding from a connection region in the main surface to which the wiring member is connected, and the expanding portion expands in an orthogonal direction orthogonal to a longitudinal direction of the wiring member in a state where the connecting wire group is connected to the wiring member.

The present invention can provide a solar cell and a solar cell module that are prevented from having characteristic deterioration, which may be caused by a defect such as a crack of a photoelectric conversion body, without causing an increase in the manufacturing cost thereof.

BRIEF DESCRIPTION OF THE DRAWINGS

FIG. 9 shows plan views of a solar cell 10 according to a second modification of the first embodiment of the present invention.

FIG. 10 is an enlarged view of portion E in FIG. 9.

FIG. 15 shows plan views of a solar cell 10 according to a third embodiment of the present invention.

FIG. 21 shows views for illustrating a method of manufacturing a solar cell module according to the fourth embodiment of the present invention.

FIG. 22 shows plan views of a solar cell 10 according to a fifth embodiment of the present invention.

FIG. 27 shows plan views of a solar cell 10 according to other embodiments of the present invention.

MODES FOR CARRYING OUT THE INVENTION

Hereinafter, embodiments of the present invention are described with reference to the drawings. Note that, in the following description of the drawings, the same or similar reference signs denote the same or similar elements and portions. In addition, it should be noted that the drawings are schematic and ratios of dimensions and the like are different from actual ones. Therefore, specific dimensions and the like should be determined in consideration of the following description. Moreover, the drawings also include portions having different dimensional relationships and ratios from each other.

First Embodiment (Overall Configuration of Solar Cell Module)

Figure 1:
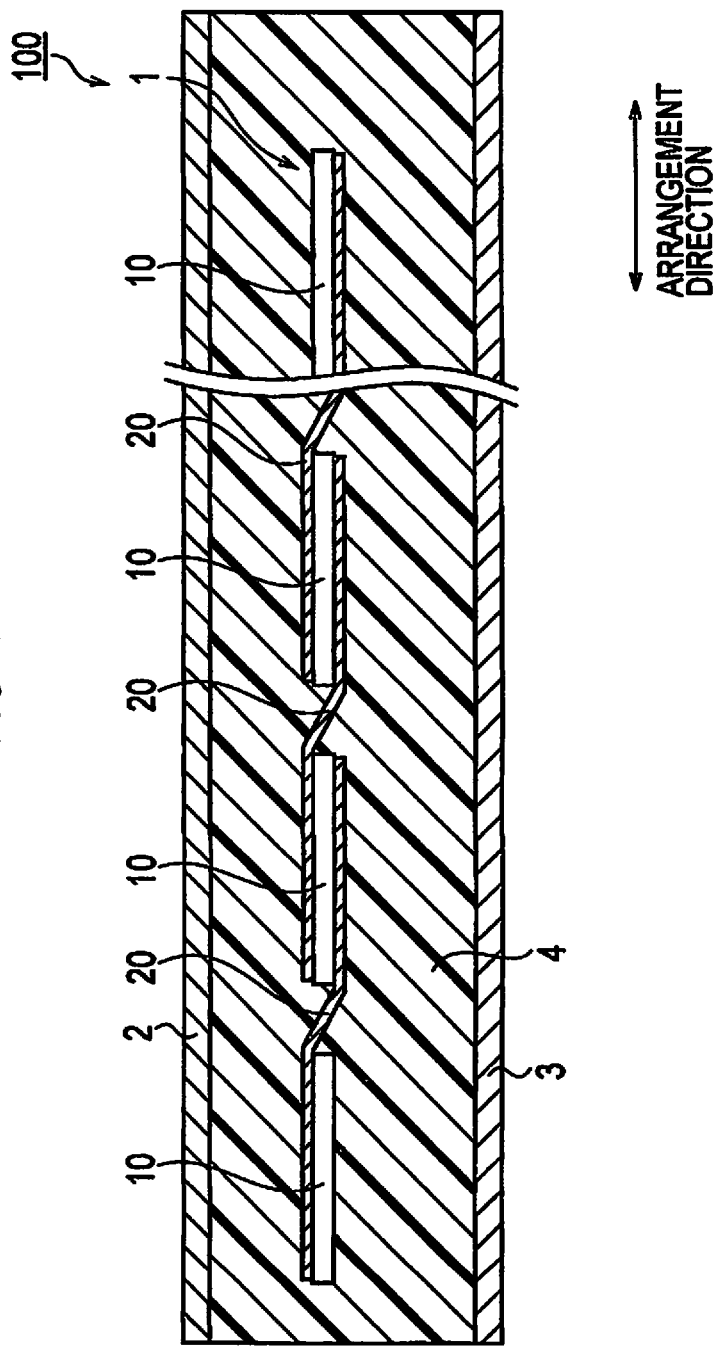
FIG. 1 is a side view of a solar cell module 100 according to a first embodiment of the present invention.

An overall configuration of a solar cell module 100 according to an embodiment of the present invention is described by referring to FIG. 1. FIG. 1 is a side view of a solar cell module 100 according to the embodiment.

The solar cell module 100 includes a solar cell string 1, a light-receiving surface side protection member 2, a back surface side protection member 3, and a sealing member 4. The solar cell module 100 is formed in such a manner that the solar cell string 1 is sealed between the light-receiving surface side protection member 2 and the back surface side protection member 3.

The solar cell string 1 includes a plurality of solar cells 10 and a plurality of wiring members 20. The solar cell string 1 is formed in such a manner that the plurality of solar cells 10 arranged in an arrangement direction are connected to each other through the plurality of wiring members 20. In other words, each of the solar cells 10 is connected to another solar cell 10 adjacent thereto through the wiring member 20.

The solar cell 10 has a light-receiving surface into which sunlight enters and a back surface provided on the opposite side of the light-receiving surface. The light-receiving surface and the back surface are main surfaces of the solar cell 10. An electrode is formed on the light-receiving surface and back surface of the solar cell 10. The configuration of the solar cell 10 is described later.

The wiring member 20 is a wiring member for electrically connecting the plurality of solar cells 10 to one another. Specifically, the wiring member 20 is bonded to a light-receiving surface of one solar cell 10 and a back surface of another solar cell adjacent to the one solar cell. With this configuration, the one solar cell 10 and another solar cell 10 are electrically connected to each other. It is preferable that the wiring member 20 be formed of a member having a low electric resistance, such as copper, silver, gold, tin, nickel, or aluminum in a plate form or an alloy thereof. Note that the surface of the wiring member 20 may be covered with a conductive member such as lead-free solder (e.g., $SnAg_{3.0}Cu_{0.5}$).

The light-receiving surface side protection member 2 is disposed on the light-receiving surface side of the sealing member 4 to protect the surface of the solar cell module 100. As the light-receiving surface side protection member 2, a translucent and water-shielding glass, translucent plastic, or the like can be used.

The back surface side protection member 3 is disposed on the back surface side of the sealing member 4 to protect the back surface of the solar cell module 100. As the back surface side protection member 3, a resin film, such as PET (polyethylene Terephthalate), a laminated film having a structure in which an Al foil is sandwiched between the resin films, and the like can be used.

The sealing member 4 seals the solar cell string 1 between the light-receiving surface side protection member 2 and the back surface side protection member 3. As the sealing member 4, a translucent resin, such as EVA, EEA, PVB, silicon, urethane, acryl, and epoxy can be used.

Note that an Al frame, for example, can be attached to the periphery of the solar cell module 100 having the above-described configuration.

(Configuration of Solar Cell)

Hereinafter, the configuration of the solar cell 10 according to the first embodiment is described by referring to FIG. 2. FIG. 2(a) is a plan view of the solar cell 10 viewed from the light-receiving surface side. FIG. 2(b) is a plan view of the solar cell 10 viewed from the back surface side.

Figure 2:
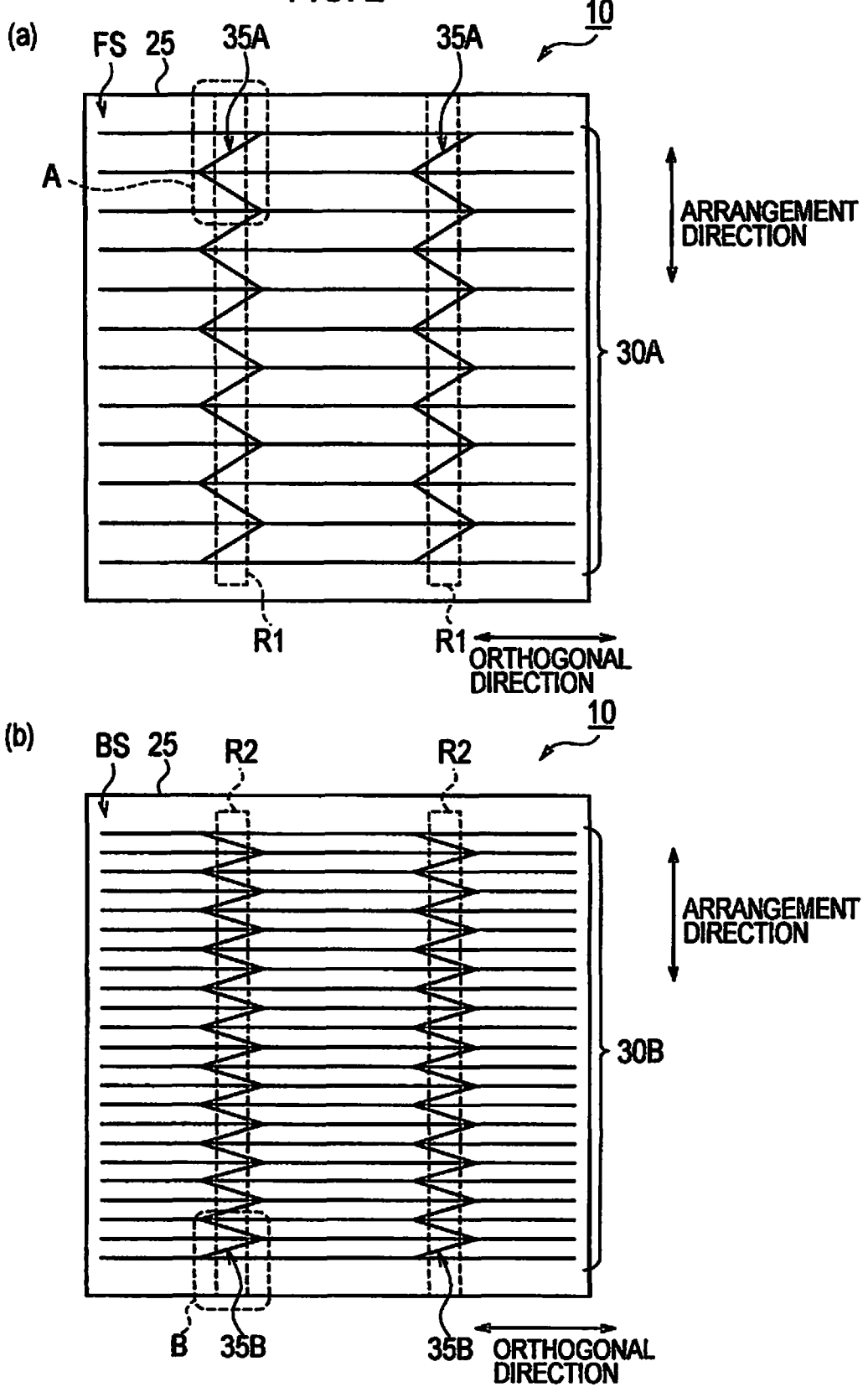
FIG. 2 shows plan views of a solar cell 10 according to the first embodiment of the present invention.

As shown in FIG. 2, the solar cell 10 includes a photoelectric conversion body 25, a plurality of light-receiving surface side fine-line electrodes 30A, back surface side fine-line electrodes 30B, a connecting wire group 35A and a connecting wire group 35B.

The photoelectric conversion body 25 has a light-receiving surface FS into which sunlight enters and a back surface BS provided on the opposite side of the light-receiving surface FS. The light-receiving surface FS and the back surface BS are main surfaces of the photoelectric conversion body 25. In the embodiment, a wiring member 20a and a wiring member 20b among the wiring members 20 are respectively bonded to a connection region R1 in the light-receiving surface FS and a connection region R2 in the back surface BS (see, FIG. 5).

In addition, the photoelectric conversion body 25 produces carriers by receiving light with the light-receiving surface FS. The carriers mean herein holes and electrons produced when sunlight is absorbed by the photoelectric conversion body 25. For example, the photoelectric conversion body 25 has an n-type region and a p-type region in the inside thereof, and a semiconductor junction is formed between the n-type region and the p-type region. The photoelectric conversion body 25 can be formed using a semiconductor substrate formed of, for example, a crystalline semiconductor material such as single crystal Si or polycrystalline Si, or a compound semiconductor material such as GaAs or InP. Note that the photoelectric conversion body 25 may have a structure in which an intrinsic amorphous silicon layer is inserted between a single crystal silicon substrate and an amorphous silicon layer to improve the characteristic of a heterojunction interface. This structure is so-called the "HIT" structure (a registered trademark of SANYO Electric Co., Ltd.).

The light-receiving surface side fine-line electrode 30A is a collector electrode configured to collect carriers from the photoelectric conversion body 25. As shown in FIG. 2(a), the light-receiving surface side fine-line electrode 30A is linearly formed on the light-receiving surface FS in an orthogonal direction substantially orthogonal to an arrangement direction, i.e., in the orthogonal direction orthogonal to the longitudinal direction of the wiring member 20. The light-receiving surface side fine-line electrode 30A can be formed by printing a conductive paste, for example.

The back surface side fine-line electrode 30B is a collector electrode configured to collect carriers from the photoelectric conversion body 25. As shown in FIG. 2(b), the back surface side fine-line electrode 30B is linearly formed on the back surface BS in the above-described orthogonal direction. The back surface side fine-line electrode 30B can be formed by printing a conductive paste the same as that used for the light-receiving surface side fine-line electrode 30A, for example.

And now, in the embodiment, as shown in FIG. 2, a distance between the plurality of back surface side fine-line electrodes 30B (e.g., approximately 1.1 mm) is narrower than a distance between the plurality of light-receiving surface side fine-line electrodes 30A (e.g., approximately 2.2 mm). However, the present invention is not intended to limit the number and shape of the back surface side fine-line electrode 30B. The back surface side fine-line electrode 30B may be formed so as to entirely cover the back surface BS, for example.

The connecting wire group 35A is formed on the light-receiving surface FS of the photoelectric conversion body 25. The connecting wire group 35A has a portion which is formed outside the connection region R1. Specifically, as shown in FIG. 2(a), in a planar view of the light-receiving surface FS, the connecting wire group 35A extends in the arrangement direction and formed in a zigzag manner. The connecting wire group 35A has a plurality of expanding portions which are bent and expanding toward the outside of the connection region R1. The expanding portions are formed in the arrangement direction in the outside of the connection region R1. With this configuration, the connecting wire group 35A has a function to support the wiring member 20a when the wiring member 20a is disposed in a position off-centered of the connection region R1. The connecting wire group 35A can be formed by printing a conductive paste the same as that used for the light-receiving surface side fine-line electrodes 30A, for example. The configuration of the connecting wire group 35A is described later.

The connecting wire group 35B is formed on the back surface BS of the photoelectric conversion body 25. The connecting wire group 35B has a portion which is formed outside the connection region R2. Specifically, as shown in FIG. 2(b), in a planar view of the back surface BS, the connecting wire group 35A is formed in a zigzag manner in the arrangement direction, and has a plurality of expanding portions which are bent and expanding toward the outside of the connection region R2. The expanding portions are formed in the arrangement direction in the outside of the connection region R2. With this configuration, the connecting wire group 35B has a function to support the wiring member 20b when the wiring member 20b is disposed in a position off-centered of the connection region R2. The connecting wire group 35B can be formed by printing a conductive paste the same as that used for the light-receiving surface side fine-line electrodes 30A, for example. The configuration of the connecting wire group 35B is described later.

(Configuration of Connecting Wire Group 35A)

Figure 3:
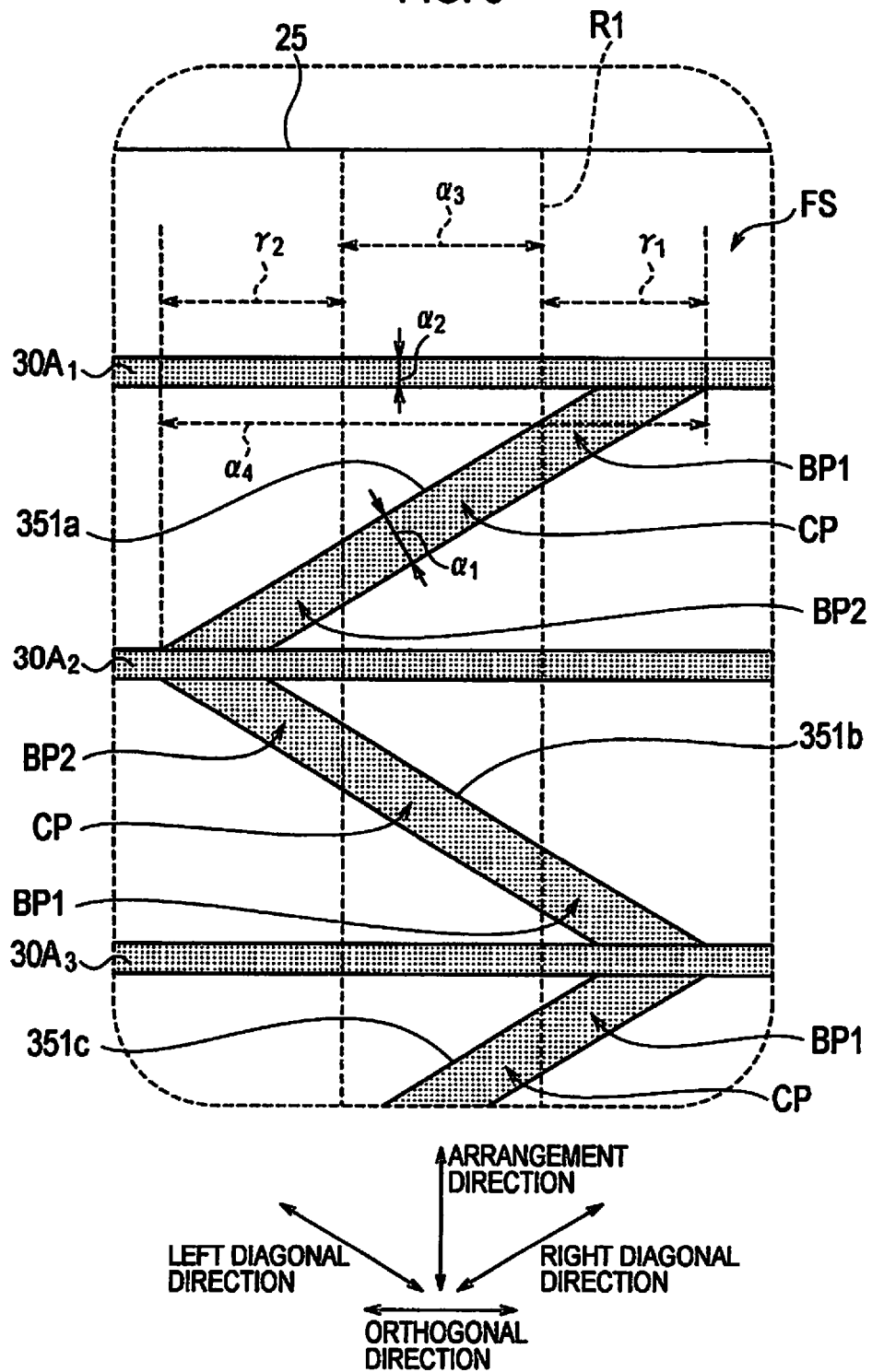
FIG. 3 is an enlarged view of portion A in FIG. 2.

Hereinafter, the configuration of the connecting wire group 35A is described by referring to FIG. 3. FIG. 3 is an enlarged view of portion A in FIG. 2(a).

As shown in FIG. 3, the connecting wire group 35A is formed of a plurality of connecting wires 351 (connecting wires 351a, 351b, 351c, . . . ). Each connecting wire 351 is electrically connected to at least one of the light-receiving surface side fine-line electrodes 30A. FIG. 3 shows an example in which each connecting wire 351 is electrically connected to two light-receiving surface side fine-line electrodes 30A. As described above, in the embodiment, the two light-receiving surface side fine-line electrodes 30A are electrically connected through the connecting wire 351.

Specifically, the connecting wire 351a is electrically connected to the light-receiving surface side fine-line electrodes $30A_1$ and $30A_2$. The connecting wire 351a is formed in a right diagonal direction which is a direction diagonally intersecting with the arrangement direction. Similarly, the connecting wire 351b is electrically connected to the light-receiving surface side fine-line electrodes $30A_2$ and $30A_3$. The connecting wire 351b is formed in a left diagonal direction which is a direction diagonally intersecting with the arrangement direction. In the embodiment, as shown in FIG. 2(a), a plurality of the connecting wires 351 are connected in a zigzag manner to form the connecting wire group 35A. With this configuration, the light-receiving surface side fine-line electrodes 30A are electrically connected to each other through the connecting wire group 35A. Accordingly, even when a direct connection between the light-receiving surface side fine-line electrode 30A and the wiring member 20a becomes poor, the connecting wire group 35A still has a function to maintain an electrical connection between the light-receiving surface side fine-line electrode 30A and the wiring member 20a.

Here, as shown in FIG. 3, each connecting wire 351 has a covered portion CP which is formed within the connection region R1 and expanding portions BP1 and BP2 which are formed outside the connection region R1. In other words, the expanding portions BP1 and BP2 are portions expanding from the connection region R1. Specifically, the expanding portions BP1 and BP2 expand in an orthogonal direction orthogonal to the longitudinal direction (arrangement direction) of the wiring member 20a in a state where the wiring member 20a is connected to the connecting wire group 35A. Note that the connection region R1 is, as described above, a region where the wiring member 20a is connected in the light-receiving surface FS of the photoelectric conversion body 25.

The expanding portion BP1 is formed on one side of the connection region R1. The expanding portion BP1 is continuous with the covered portion CP. The expanding portion BP2 is formed the other side of the connection region R1. In other words, the expanding portion BP2 is formed on the opposite side of the first expanding portion BP1 across the connection region R1. The expanding portion BP2 is continuous with the covered portion CP. In this manner, the connecting wire group 35A has the plurality of expanding portions BP1 formed on the one side of the connection region R1 and the plurality of expanding portions BP2 formed on the other side of the connection region R1, in a substantially entire region of the longitudinal direction of the connection region R1. Note that a length $\gamma1$ of the expanding portion BP1 expanding from the connection region R1 and a length $\gamma2$ of the expanding portion BP2 expanding from the connection region R1 are determined as needed according to the positional accuracy (tolerance) required to connect the wiring member 20a to the connecting wire group 35A.

Moreover, as shown in FIG. 3, a line width $\alpha1$ of each connecting wire 351 is larger than a line width $\alpha2$ (e.g., approximately 0.1 mm) of each light-receiving surface side fine-line electrode 30A. In the embodiment, the line width $\alpha1$ of each connecting wire 351 is, for example, 100 to 250 μm and the line width $\alpha2$ of each light-receiving surface side fine-line electrode 30A is, for example, 80 to 120 μm. In addition, the line width $\alpha1$ of each connecting wire 351 is preferably 1.2 times or larger than the line width $\alpha2$ of each light-receiving surface side fine-line electrode 30A, and more preferably 1.5 times or larger than the line width $\alpha2$ of each light-receiving surface side fine-line electrode 30A. With this configuration, even when a direct contact between the two or more light-receiving surface side fine-line electrodes 30A and the wiring member 20a becomes poor, a good electrical connection between the two or more light-receiving surface side fine-line electrodes 30A and the wiring member 20a can be maintained.

In addition, the line width $\alpha1$ of each connecting wire 351 is smaller than a line width (e.g., approximately 1.5 mm) of a connection electrode which is generally provided for connecting the wiring member 20a. The line width $\alpha1$ of each connecting wire 351 is preferably smaller than the line width of the wiring member 20a, and more preferably smaller than a half of the line width of the wiring member 20a. Furthermore, the line width $\alpha1$ of each connecting wire 351 is more preferably smaller than one third of the line width of the wiring member 20a. In general, the line width of the connection electrode is equal to a line width of the wiring member 20a. Accordingly, as compared with a case where a general connection electrode is formed, thermal stress generated during the formation thereof can be reduced. Thus, the photoelectric conversion body 25 can be prevented from warping. The line width of the wiring member 20a is equal to a width $\alpha3$ (e.g., approximately 1.5 mm) in the orthogonal direction of the connection region R1. Accordingly, the line width $\alpha1$ of each connecting wire 351 is smaller than the width $\alpha3$ shown in FIG. 3.

In addition, a formation width $\alpha4$ (e.g., approximately 2.0 mm) in the orthogonal direction in which the connecting wire 351 is formed is larger than the width $\alpha3$ of the connection region R1 in the orthogonal direction. In other words, the formation width (the width $\alpha4$) of the connecting wire group 35A in the orthogonal direction is wider than the line width of the wiring member 20a in the orthogonal direction. This is because the connecting wire 351 has the expanding portions BP1 and BP2 expanding toward the both sides of the connection region R1.

(Configuration of Connecting Wire Group 35B)

Figure 4:
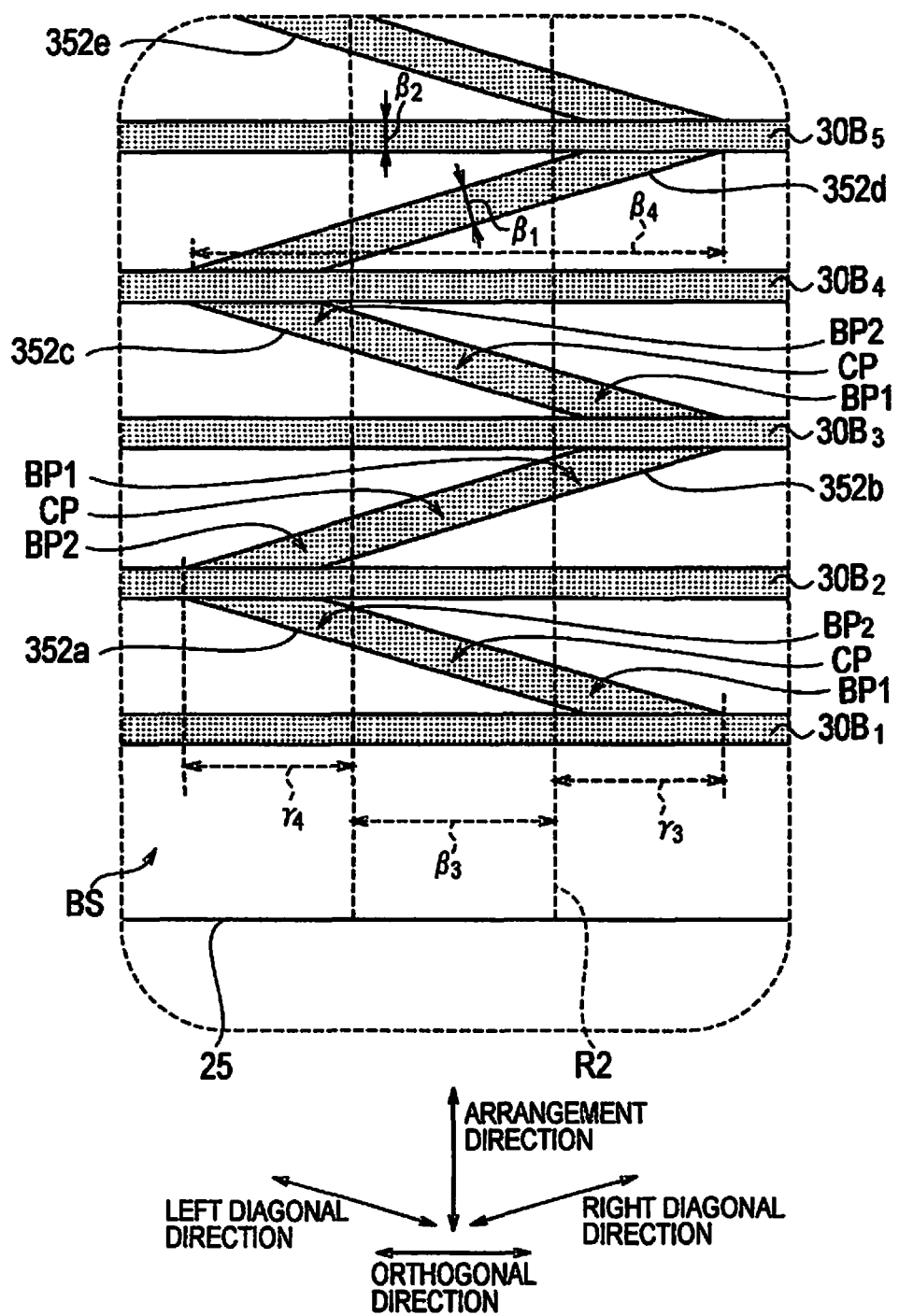
FIG. 4 is an enlarged view of portion B in FIG. 2.

Hereinafter, the configuration of the connecting wire group 35B is described by referring to FIG. 4. FIG. 4 is an enlarged view of portion B in FIG. 2(b).

As shown in FIG. 4, the connecting wire group 35B is formed of a plurality of connecting wires 352 (connecting wires 352a, 352b, 352c, . . . ). In the embodiment, the number of the back surface side fine-line electrodes 30B is larger than that of the light-receiving surface side fine-line electrodes 30A. Accordingly, the number of the connecting wires 352 is larger than that of the connecting wires 351. Each connecting wire 352 is electrically connected to at least one of the back surface side fine-line electrodes 30B. FIG. 4 shows an example in which each connecting wire 352 is electrically connected to two back surface side fine-line electrodes 30B. As described above, in the embodiment, the two back surface side fine-line electrodes 30B are electrically connected through the connecting wire 352.

Specifically, the connecting wire 352a is electrically connected to the back surface side fine-line electrodes $30B_1$ and $30B_2$. The connecting wire 352a is formed in a right diagonal direction which is a direction diagonally intersecting with the arrangement direction. Similarly, the connecting wire 352b is electrically connected to the back surface side fine-line electrodes $30B_2$ and $30B_3$. The connecting wire 352b is formed in a left diagonal direction which is a direction diagonally intersecting with the arrangement direction. Similarly, the connecting wires 352c to 352e are also electrically connected to the back surface side fine-line electrodes $30B_4$ and $30B_5$.

In the embodiment, as shown in FIG. 2(b), the plurality of the connecting wires 352 are connected in a zigzag manner to form the connecting wire group 35B. With this configuration, the back surface side fine-line electrodes 30B are electrically connected to each other through the connecting wire group 35B. Accordingly, the connecting wire group 35B also has a function to maintain an electrical connection between the wiring member 20b and the back surface side fine-line electrode 30B having a direct connection in a poor condition with the wiring member 20b.

Here, as shown in FIG. 4, each connecting wire 352 has a covered portion CP which is formed within the connection region R2 and expanding portions BP1 and BP2 which are formed outside the connection region R2. In other words, the expanding portions BP1 and BP2 are portions expanding from the connection region R2. Note that the connection region R2 is, as described above, a region where the wiring member 20b is connected in the back surface BS of the photoelectric conversion body 25.

The covered portion CP is formed in the left diagonal direction within the connection region R2.

The expanding portion BP1 is formed on one side of the connection region R2. The expanding portion BP1 is continuous with the covered portion CP. The expanding portion BP2 is formed on the other side of the connection region R2. In other words, the expanding portion BP2 is formed on the opposite side of the expanding portion BP1 across the connection region R2. The expanding portion BP2 is continuous with the covered portion CP. Note that a length $\gamma 3$ of the expanding portion BP1 expanding from the connection region R2 and a length $\gamma 4$ of the expanding portion BP2 expanding from the connection region R2 are determined as needed according to the positional accuracy (tolerance) required to connect the wiring member 20b to the connecting wire group 35B.

As described above, the connecting wire group 35B includes a plurality of the expanding portions BP1 formed on the one side of the connection region R2 and a plurality of the expanding portions BP2 formed on the other side of the connection region R2, the expanding portions BP1 and BP2 being dispersed across a substantially entire region in the longitudinal direction of the connection region R2.

Moreover, as shown in FIG. 4, a line width $\beta 1$ of each connecting wire 352 is nearly equal to or larger than a line width $\beta 2$ (e.g. approximately 0.1 mm) of each back surface side fine-line electrode 30B. It is less important for the back surface side fine-line electrode 30B to consider an incidence loss of light. Thus, the back surface side fine-line electrode 30B can be formed with a width wider than that of the light-receiving surface side fine-line electrode 30A. Each back surface side fine-line electrode 30B can be formed with a line width $\beta 2$ being approximately 80 to 200 µm, for example. Also, the line width $\beta 1$ of each connecting wire 352 is, for example, approximately 100 to 250 µm. In addition, the line width $\beta 1$ of each connecting wire 352 is preferably 1.2 times or larger than the line width $\beta 2$ of each back surface side fine-line electrode 30B, and more preferably 1.5 times or larger than the line width $\beta 2$ of each back surface side fine-line electrode 30B. With this configuration, for example, even when a direct contact between the two or more back surface side fine-line electrodes 30B and the wiring member 20b becomes poor, a good electrical connection between the two or more back surface side fine-line electrodes 30B and the wiring member 20b can be maintained.

Additionally, the line width $\beta 1$ of each connecting wire 352 is smaller than a line width of a connection electrode which is generally provided for connecting the wiring member 20b, i.e., the width $\beta 3$ (e.g., approximately 1.5 mm) in the orthogonal direction of the connection region R2. With this configuration, the photoelectric conversion body 25 can be more prevented from warping than in the case where a general connection electrode is formed.

In addition, a formation width $\beta 4$ (e.g., approximately 2.0 mm) in which the connecting wire 352 is formed in the orthogonal direction is larger than the width $\beta 3$ of the connection region R2. In other words, the formation width (the width $\beta 4$) of the connecting wire group 35B in the orthogonal direction is wider than the line width of the wiring member 20b in the orthogonal direction.

(Configuration of Solar Cell String)

Figure 5:
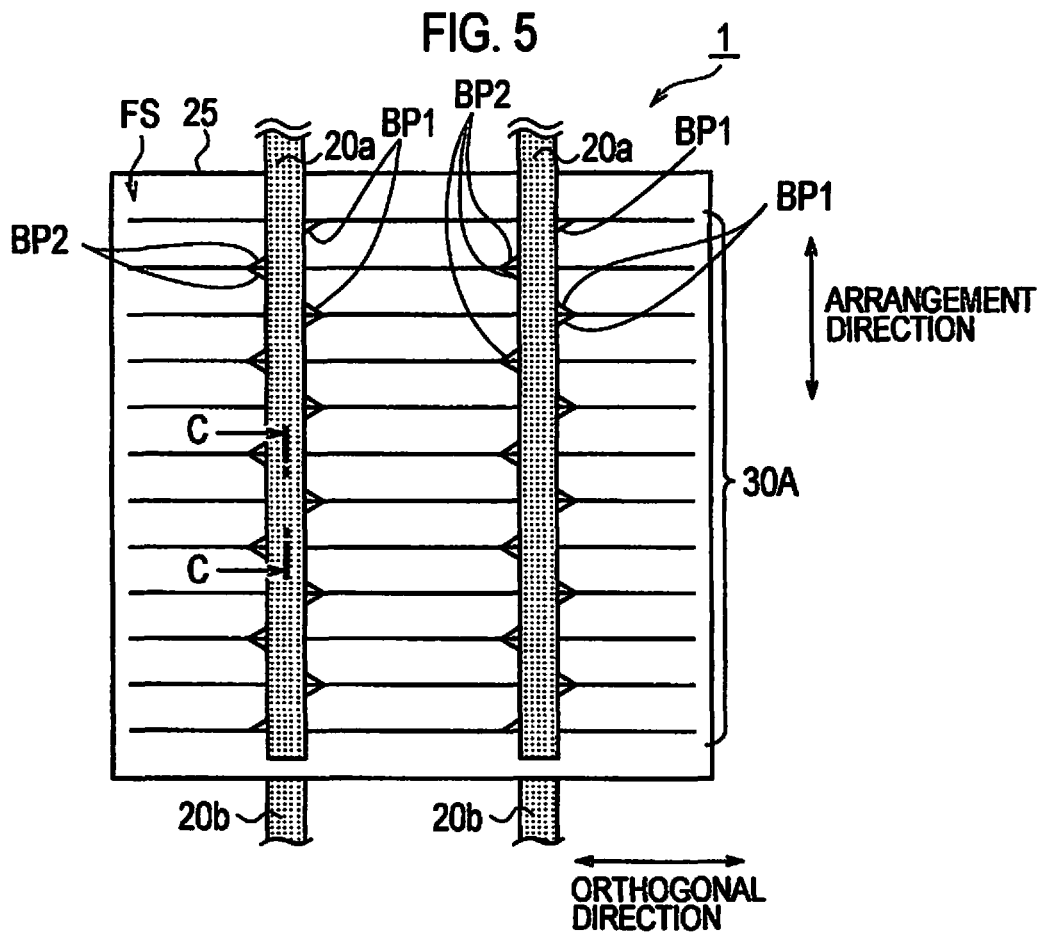
FIG. 5 is a plan view of a solar cell string 1 according to the first embodiment of the present invention.
Figure 6:
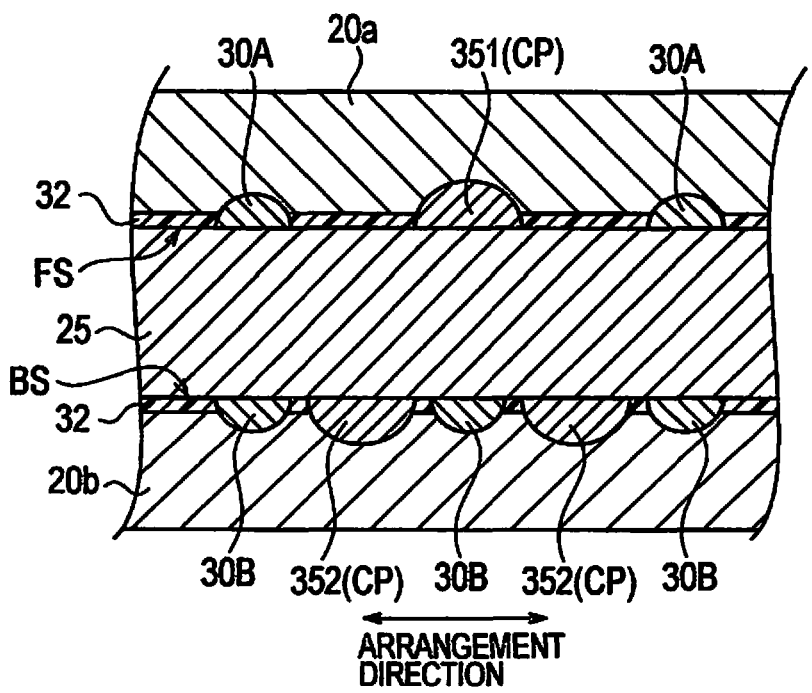
FIG. 6 is an enlarged cross-sectional view taken along the C-C line in FIG. 5.

Hereinafter, the configuration of the solar cell string 1 is described by referring to FIGS. 5 and 6. FIG. 5 is a plan view of the solar cell string 1 viewed from the light-receiving surface side. FIG. 6 is an enlarged cross-sectional view taken along the C-C line in FIG. 5.

As shown in FIG. 5, in the plan view of the light-receiving surface FS, the expanding portions BP1 and BP2 of each connecting wire 351 are expanded from the wiring member 20a and exposed. On the other hand, in the plan view of the light-receiving surface FS, the covered portion CP of each connecting wire 351 is covered with the wiring member 20a, and thus unexposed. In addition, across the length direction (i.e., the arrangement direction) of the wiring member 20a, a plurality of the expanding portions BP1 are exposed on one side of the wiring member 20a and a plurality of the expanding portions BP2 are exposed on the other side of the wiring member 20a. Although it is not shown in the figure, the configuration is the same in the plan view of the back surface BS.

As shown in FIG. 6, the wiring member 20a is bonded to the light-receiving surface FS with a resin adhesive 32, while the wiring member 20b is bonded to the back surface BS with the resin adhesive 32. It is preferable that the resin adhesive 32 be cured at a temperature equal to or lower than a temperature at the melting point of the lead-free solder (approximately 200° C.). As such resin adhesive 32, for example, a two-liquid reaction adhesive in which a curing agent is mixed in an epoxy resin, acryl resin, or urethane resin can be used in addition to a thermosetting resin adhesive such as an acryl resin or flexible polyurethane-based resin. Also, the resin adhesive 32 may contain a plurality of conductive particles. As such conductive particles, nickel, gold-coated nickel or the like can be used.

As the resin adhesive 32 containing the conductive particles, an anisotropic conductive adhesive can be used. Note that the present invention does not necessarily require that the resin adhesive be anisotropic. However, it is preferable that a content of the conductive particles contained in the resin adhesive 32 be an amount in a certain extent enough to form a layer to three layers after being cured. This can reduce a contact resistance generated when a number of the conductive particles come in contact with one another in the thickness direction. As a result, a resistance of the resin adhesive 320 in the longitudinal direction can be reduced after being cured.

When the resin adhesive 32 containing the conductive particles is used, the wiring member 20*a* and the light-receiving surface side fine-line electrode 30A are electrically connected through the conductive particles. Similarly, the wiring member 20*b* and the back surface side fine-line electrode 30B are electrically connected through the conductive particles. Depending on a manufacturing condition, there is also a case where the wiring member 20*a* (the wiring member 20*b*) and the light-receiving surface side fine-line electrode 30A (the back surface side fine-line electrode 30B) are electrically connected through a direct contact therebetween in addition to the case where an electrical connection is made through the conductive particles.

FIG. 6 is an example of the case where an electrical connection is made through a direct contact between the wiring member 20*a* and the light-receiving surface side fine-line electrode 30A and between the wiring member 20*b* and the back surface side fine-line electrode 30B. Note that the conductive particles are not shown in FIG. 6.

The wiring member 20*a* has a conductive layer such as a solder layer on the surface facing the light-receiving surface side fine-line electrode 30A. The light-receiving surface side fine-line electrode 30A is designed to cave in the solder layer so as to be electrically connected to the wiring member 20*a* through a direct contact.

Similarly, the wiring member 20*b* has a conductive layer such as a solder layer on the surface facing the back surface side fine-line electrode 30B. The back surface side fine-line electrode 30B is designed to cave in the solder layer so as to be electrically connected to the wiring member 20*b* through a direct contact.

When an electrical connection between the wiring member 20*a* and the light-receiving surface side fine-line electrode 30A or between the wiring member 20*b* and the back surface side fine-line electrode 30B is intended to be made through a direct contact, the light-receiving surface side fine-line electrode 30A or the back surface side fine-line electrode 30B is not necessarily required to be designed to cave in the conductive layer as described above. However, it is preferable that the light-receiving surface side fine-line electrode 30A or the back surface side fine-line electrode 30B cave in the conductive layer as described above. The reason is that the configuration can improve a mechanical strength in a connected portion between the wiring member 20*a* and the light-receiving surface side fine-line electrode 30A and a connected portion between the wiring member 20*b* and the back surface side fine-line electrode 30B.

Note that in a case where used is a resin adhesive 32 which does not sufficiently contain conductive particles or contains insulation particles rather than the conductive particles, an electrical connection through a direct contact between a wiring member and a fine-line electrode becomes dominant.

The connecting wire 351 is electrically connected to at least one of the light-receiving surface side fine-line electrodes 30A. Accordingly, the connecting wire 351 is electrically connected to the wiring member 20*a* substantially through the light-receiving surface side fine-line electrode 30A. In addition to this, the connecting wire 351 may be electrically connected to the wiring member 20*a* through a direct contact.

The electrical connection between the connecting wire 351 and the wiring member 20*a* is achieved when the surface of the connecting wire 351 and the surface of the wiring member 20*a* are brought into contact with each other. Such a case includes that the connecting wire 351 is connected to the wiring member 20*a* in a manner to cave in the surface of the wiring member 20*a*. FIG. 6 shows the case as an example.

In FIG. 6, the connecting wire 351 caves in the surface of the wiring member 20*a*. The caving-in of the connecting wire 351 reinforces the connection strength between the wiring member 20*a* and the solar cell 10. Thus, the wiring member 20*a* can be made difficult to come off the connecting wire 351.

In the case illustrated in FIG. 6, the connecting wire 351 is formed so as to have a thickness larger than the thickness of the light-receiving surface side fine-line electrode 30A and also formed so as to have a height higher than the height of the light-receiving surface side fine-line electrode 30A. Thus, the depth that the connecting wire 351 (the covered portion CP) caves in the surface of the wiring member 20*a* is larger than the depth that the light-receiving surface side fine-line electrode 30A caves in the surface of the wiring member 20*a*. The fact that the caving-in depth of the connecting wire 351 is larger than the caving-in depth of the light-receiving surface side fine-line electrode 30A prevents the expansion and contraction of the wiring member 20*a* caused by a temperature change from influencing the light-receiving surface side fine-line electrode 30A. In other words, the connecting wire 351 absorbs the thermal expansion and contraction of the wiring member 20*a*, so that stress applied to the light-receiving surface side fine-line electrode 30A is reduced.

Conversely to FIG. 6, in a case where the connecting wire 351 is formed so as to have a height lower than the height of the light-receiving surface side fine-line electrode 30A, the connecting wire 351 slightly caves in the surface of the wiring member 20*a* or does not cave in at all. Thus, the depth that the light-receiving surface side fine-line electrode 30A caves in the surface of the wiring member 20*a* is larger than the depth that the connecting wire 351 caves in the surface of the wiring member 20*a*. For this reason, the wiring member 20*a* and the light-receiving surface side fine-line electrode 30A have a good electrical connection.

On the other hand, the electrical connection through a direct contact between the connecting wire 352 and the wiring member 20*b* is achieved when the surface of the connecting wire 352 and the surface of the wiring member 20*b* are brought into contact with each other. An example is such that the connecting wire 352 is connected to the wiring member 20*b* so as to cave in the surface of the wiring member 20*b*. FIG. 6 shows the case as an example.

In FIG. 6, the connecting wire 352 caves in the surface of the wiring member 20*b*. The caving-in of the connecting wire 352 reinforces the connection strength between the wiring member 20*b* and the solar cell 10. Thus, similar to the wiring member 20*a*, the wiring member 20*b* can be made difficult to come off the solar cell 10.

(Method of Manufacturing Solar Cell Module)

Hereinafter, a method of manufacturing the solar cell module 100 according to the embodiment is described.

(1) Process of Manufacturing the Solar Cell

First of all, a conductive paste such as a epoxy based thermosetting silver paste is arranged in a predetermined pattern on the light-receiving surface FS and back surface BS of the photoelectric conversion body 25 using a printing method such as a screen printing method or offset printing method. For example, FIG. 2 shows the predetermined pattern.

Next, the conductive paste is dried under a predetermined condition, so that a light-receiving surface side fine-line electrode 30A, a back surface side fine-line electrode 30B, a connecting wire group 35A and a connecting wire group 35B are formed.

Note that the line width of the light-receiving surface side fine-line electrode 30A is extremely fine (e.g., approximately 0.1 mm). For this reason, when the light-receiving surface side fine-line electrode 30A is formed using the screen printing method, the conductive paste is printed in the orthogonal direction, so that the light-receiving surface side fine-line electrode 30A can be accurately formed.

It should be noted, however, that the conductive paste printed in the arrangement direction may be rubbed in the course of printing the conductive paste in the orthogonal direction. For this reason, when the light-surface side fine-line electrode 30A and the connecting wire group 35A are formed at once, it is preferable that the right diagonal direction in which the connecting wire group 35A is formed be made close to the orthogonal direction in order to prevent the rubbing.

(2) Process of Manufacturing the Solar Cell String

After that, the solar cells 10 are electrically connected to each other through the wiring member 20.

Specifically, the wiring member 20a is disposed on the connection region R1 through a tape-shaped or paste-like resin adhesive 32. Then, the wiring member 20a is heated while being pushed onto the light-receiving surface FS. In doing so, one portion of the light-receiving surface side fine-line electrode 30A and the covered portion CP of the connecting wire 351 are electrically connected to the wiring member 20a. At least one part of each of the expanding portions BP1 and BP2 of the connecting wire 351 expands from the wiring member 20a. Similarly, the wiring member 20b is disposed on the connection region R2 through the resin adhesive 32. Then, the wiring member 20b is heated while being pushed onto the back surface BS. In doing so, one portion of the back surface side fine-line electrode 30B and the covered portion CP of the connecting wire 352 are electrically connected to the wiring member 20b. At least one part of each of the expanding portions BP1 and BP2 of the connecting wire 352 expands from the wiring member 20b. The connections of the wiring members 20a and 20b may be performed simultaneously or separately.

(3) Modularization Process

After that, an EVA (sealing member 4) sheet, a solar cell string 1, an EVA (sealing member 4) sheet, and a PET sheet (back surface side protection member 3) are sequentially laminated on a glass substrate (light-receiving surface side protection member 2) to form a laminated body.

Then, the laminated body is heated under a predetermined condition to cure the EVA. In this manner, the solar cell module 100 is manufactured. Note that a terminal box, an Al frame, or the like can be attached to the solar cell module 100.

Advantageous Effects

The solar cell 10 according to the first embodiment includes the plurality of the connecting wires 351, each having the expanding portion BP1 expanding toward one side of the connection region R1 in the light-receiving surface FS. The expanding portion BP1 of each of the connecting wires 351 is dispersedly disposed along the longitudinal direction of the connection region R1.

Accordingly, even when the wiring member 20a is off-centered of the connection region R1 and then connected onto the plurality of expanding portions BP1, the photoelectric conversion body 25 can be prevented from having a defect, such as a crack, due to a large pressure locally applied to the photoelectric conversion body 25. As a result, a deterioration in the characteristic of the solar cell can be prevented. Moreover, the connecting wire group 35A has the expanding portions BP1, and, thus, there is no need to improve the positional accuracy to connect the wiring member 20a to the connecting wire group 35A. In other words, the solar cell 10 (the solar cell module 100) can be prevented from having the deterioration in the characteristic due to a defect, such as a crack, in the photoelectric conversion body 25 and, at the same time, avoid increasing the manufacturing cost.

Furthermore, the plurality of the expanding portions BP1 are electrically connected to at least one light-receiving surface side fine-line electrode 30A. Thus, as compared with the case where the connecting wire 351 is not included, a resistance loss can be reduced.

Note that the above-described effects can be obtained in spite that the covered portion CP is present or absent. In other words, each connecting wire 351 may be formed only of the expanding portion BP1. Also, the above-described effects can be obtained by not only the expanding portion BP1 but also the expanding portion BP2. Accordingly, when each connecting wire 351 has the expanding portions BP1 and BP2, the deterioration in the characteristic of the solar cell can be more securely prevented than in the case where each connecting wire 351 only has the expanding portion BP1.

The covered portion CP in the connecting wire 351a is formed in the right diagonal direction diagonally intersecting with the orthogonal direction. Accordingly, as compared with the case where the connecting wire 351a is formed in the arrangement direction, a longer covered portion CP can be ensured. For this reason, in the case where an electrical connection is intended through a direct contact between the connecting wire 351a and the wiring member 20a in such a manner that the connecting wire 351a caves in the surface of the wiring member 20a, a caving-in portion of the connecting wire 351a can be increased. Thus, the wiring member 20a can be made difficult to come off the light-receiving surface side fine-line electrode $30A_1$.

Similarly, the connecting wire 351a is electrically connected to the light-receiving surface side fine-line electrodes $30A_1$ and $30A_2$. Accordingly, even when a direct connection between the wiring member 20a and the light-receiving surface side fine-line electrode $30A_1$ becomes poor, an electrical connection between the wiring member 20a and the light-receiving surface side fine-line electrode $30A_1$ can be maintained through the connecting wire 351a.

As described above, the direct connection between the wiring member 20a and the light-receiving surface side fine-line electrode $30A_1$ can be strengthened and the electrical connection therebetween can be maintained. Consequently, a decrease in carrier collecting efficiency of the solar cell 10 can be suppressed.

Moreover, the connecting wire 351a is formed in the right diagonal direction that is closer to the orthogonal direction than to the arrangement direction. Accordingly, in a case where a conductive paste is printed in the orthogonal direction in order to improve the accuracy of printing the light-receiving surface side fine-line electrode 30A, the rubbing of the conductive paste can be more prevented than in the case where the connecting wire 351a is formed in the arrangement direction.

In the embodiment, the formation width α4 in which the connecting wire 351 is formed in the orthogonal direction is larger than the width α3 of the connection region R1 in the orthogonal direction. For this reason, even when the wiring member 20a is connected in a position off-centered of the connection region R1, only one side of the wiring member 20a in the orthogonal direction is prevented from being connected to the connecting wire 351a. In other words, the accuracy (tolerance) in the disposing position of the wiring member 20a can have a margin. This prevents a stress concentration on the one side of the wiring member 20a in the process of connecting the wiring member 20a.

The line width a1 of the connecting wire 351 according to the embodiment is smaller than the width α3 of the connection region R1 in the orthogonal direction, that is, the line width of the connection electrode which is generally provided. Here, the photoelectric conversion body 25 and the conductive paste (a component of the connecting wire group 35A or the connection electrode) have different line expansion coefficients. Thus, a warp may be caused in the photoelectric conversion body 25. In the embodiment, the line width α1 is smaller than the width α3. Thus, as compared with the case where the general connection electrode is formed, the photoelectric conversion body 25 can be prevented from warping.

In addition, the line width α1 of the connecting wire 351 according to the first embodiment is larger than the line width α2 of each light-receiving surface side fine-line electrode 30A. Accordingly, even when a direct contact between the two or more light-receiving surface side fine-line electrodes 30A and the wiring member 20a becomes poor, a good electrical connection between the two or more light-receiving surface side fine-line electrodes 30A and the wiring member 20a can be maintained through the one connecting wire 351. Note that similar effects can be equally obtained through the connecting wire 352.

Moreover, in the embodiment, the number of the plurality of connecting wires 352 forming the connecting wire group 35B are larger than the number of the plurality of connecting wires 351 forming the connecting wire group 35A. In other words, the connection strength of the wiring member 20b to be connected to the back surface BS is larger than the connection strength of the wiring member 20a to be connected to the light-receiving surface FS. The back surface side protection member 3 in a film form, such as a resin film, has a higher flexibility than the light-receiving surface side protection member 2 formed of glass or the like. Accordingly, the sealing member 4 and the wiring member 20 can move more largely on the back surface side of the solar cell string 1 than the light-receiving surface side thereof. However, in the embodiment, the connection strength of the wiring member 20b to be connected to the back surface BS is larger, so that the wiring member 20b can be prevented from separating from the back surface BS.

First Modification of First Embodiment

Hereinafter, a first modification of the first embodiment is described by referring to the drawings. In the following description, points different from the first embodiment are mainly described. Specifically, in the modification, the description is given of a case where one connecting wire is electrically connected to three or more light-receiving surface side fine-line electrodes 30A.
(Configuration of Solar Cell)

Figure 7:
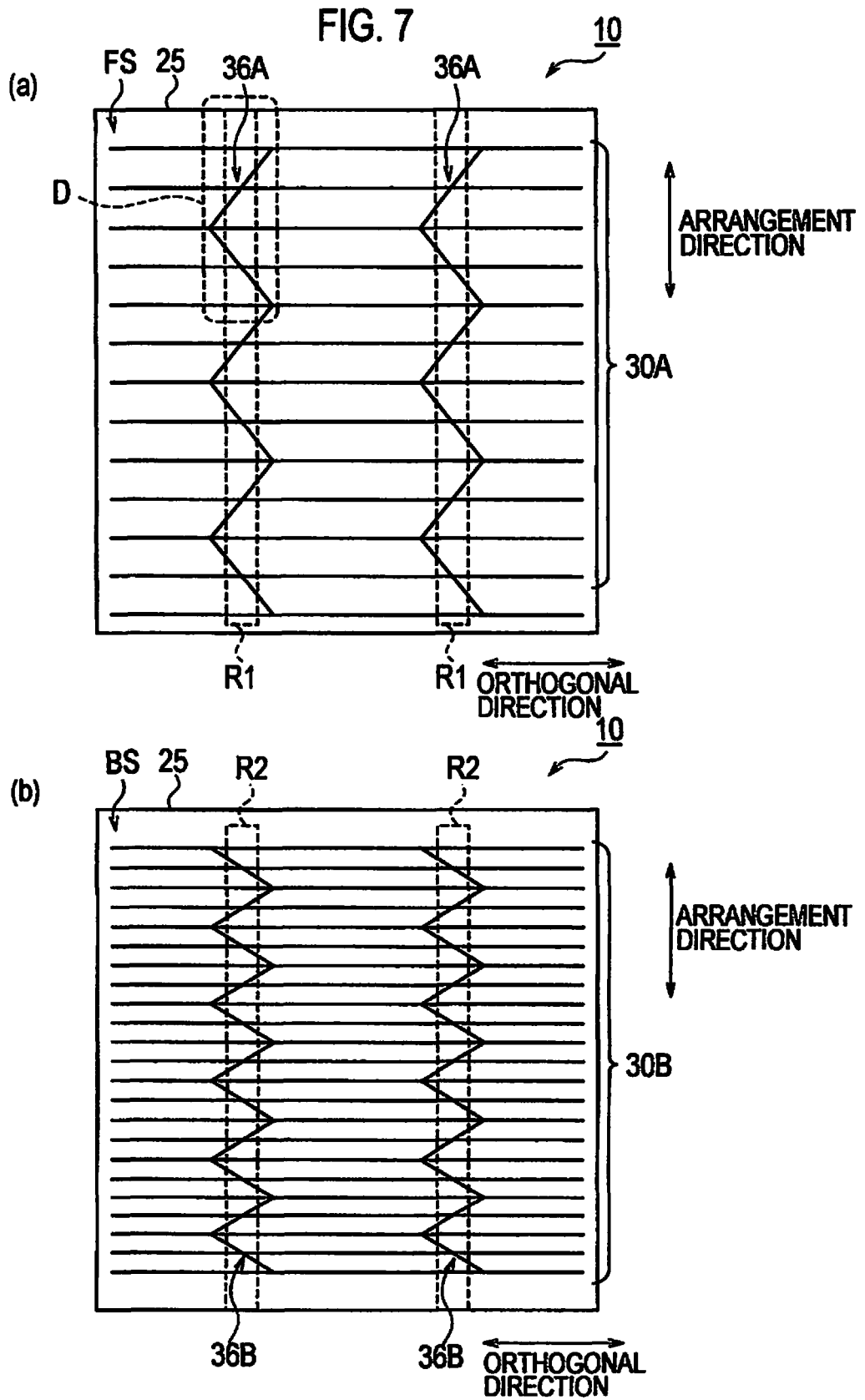
FIG. 7 shows plan views of a solar cell 10 according to a first modification of the first embodiment of the present invention.

The configuration of the solar cell 10 according to the modification is described by referring to FIG. 7. FIG. 7(a) is a plan view of the solar cell 10 viewed from the light-receiving surface side. FIG. 7(b) is a plan view of the solar cell 10 viewed from the back surface side. Note that, the connecting wire group 36A and the connecting wire group 36B in the modification have the same configurations. Thus, only the connecting wire group 36A is mainly described below.

The connecting wire group 36A is formed on the light-receiving surface FS of the photoelectric conversion body 25. The connecting wire group 36A has a portion expanding toward the outside of the connection region R1. Specifically, as shown in FIG. 7(a), in a plan view of the light-receiving surface FS, the connecting wire group 36A is formed in a zigzag manner in the arrangement direction. The connecting wire group 36A has a plurality of expanding portions having a bent shape formed outside of the connection region R1. The expanding portions are formed in the arrangement direction in the outside of the connection region R1. With this configuration, the connecting wire group 36A has a function to support the wiring member 20a when the wiring member 20a is disposed in a position off-centered of the connection region R1.
(Configuration of Connecting Wire Group 36A)

Figure 8:
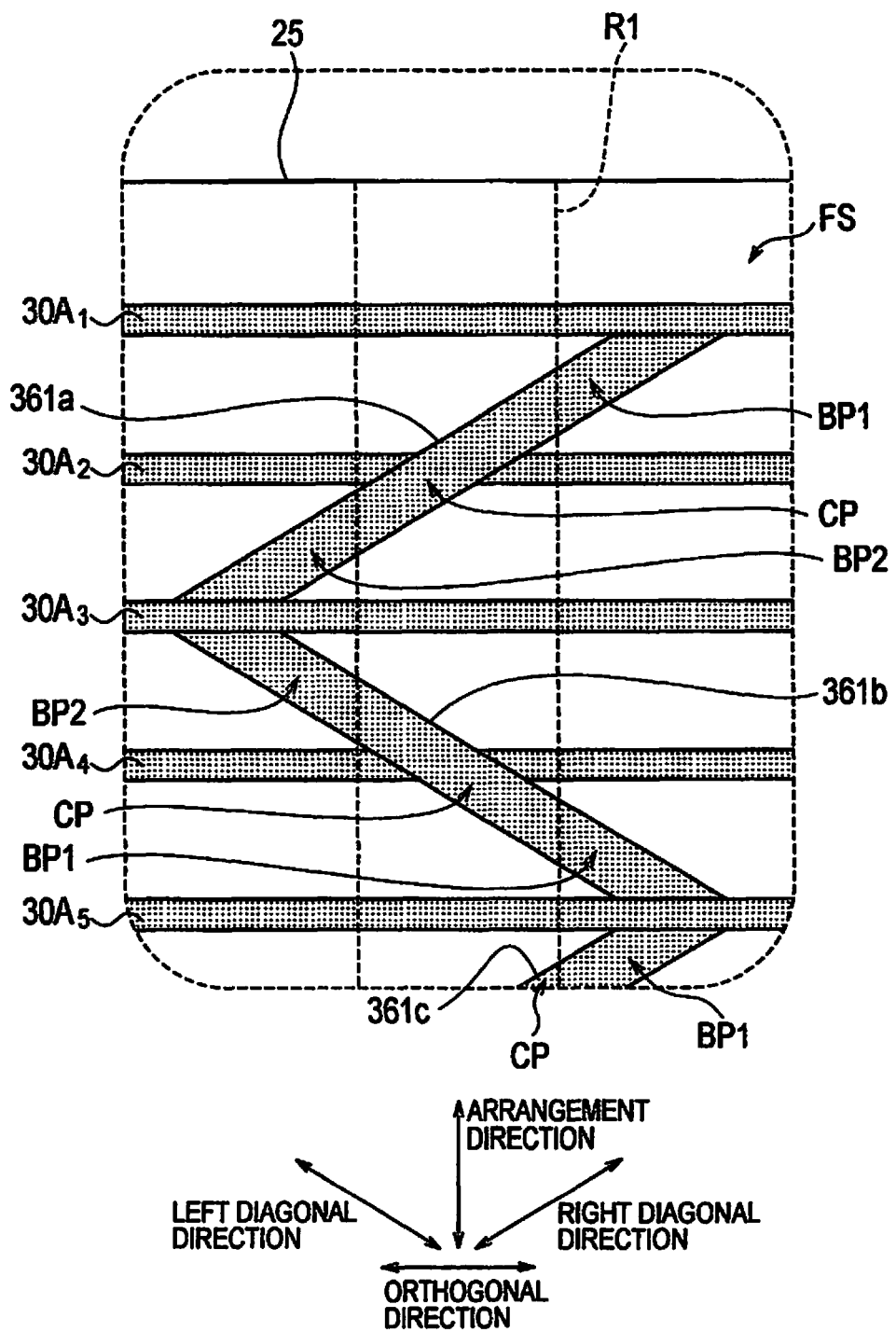
FIG. 8 is an enlarged view of portion D in FIG. 7.

The configuration of the connecting wire group 36A is described by referring to FIG. 8. FIG. 8 is an enlarged view of portion D in FIG. 7.

As shown in FIG. 8, the connecting wire group 36A is formed of a plurality of connecting wires 361 (connecting wires 361a, 361b, 361c, . . . ). Each connecting wire 361 is electrically connected to three light-receiving surface side fine-line electrodes 30A.

Specifically, the connecting wire 361a is electrically connected to three light-receiving surface side fine-line electrodes $30A_1$ to $30A_3$. The connecting wire 361a is formed in the right diagonal direction. Similarly, the connecting wire 361b is electrically connected to the light-receiving surface side fine-line electrodes $30A_3$ to $30A_5$. The connecting wire 361b is formed in a left diagonal direction. However, it should be noted that, in the modification, inclinations of the right diagonal direction and the left diagonal direction with respect to the orthogonal direction are larger than those of the first embodiment.

As described above, in the modification, as shown in FIGS. 7(a) and 8, the plurality of connecting wires 361 are connected in a zigzag manner to form the connecting wire group 36A. With this configuration, the light-receiving surface side fine-line electrodes 30A are electrically connected to each other through the connecting wire group 36A. Accordingly, the connecting wire group 36A has a function to maintain an electrical connection between the wiring member 20a and the light-receiving surface side fine-line electrode 30A having a poor direct connection with the wiring member 20a. Although it is not shown in the figure, the configuration is the same in the plan view of the back surface BS.

Advantageous Effects

The modification can exert effects similar to those of the first embodiment. In addition, the connecting wire 361a according to the modification is electrically connected to the three light-receiving surface side fine-line electrodes $30A_1$ to $30A_3$. Accordingly, the inclination of the connecting wire 361 with respect to the orthogonal direction can be set larger than the inclination of the connecting wire 351 according to the first embodiment with respect to the orthogonal direction. In other words, the direction in which the connecting wire 361 extends can be brought closer to the arrangement direction, so that an amount of using the conductive paste can be reduced. As a result, the cost of manufacturing the solar cell 10 can be reduced, and the stress caused in an interface between the connecting wire 361 and the photoelectric conversion body 25 can be made smaller than the stress caused in an interface between the connecting wire 351 and the photoelectric conversion body 25 according to the first embodiment.

Moreover, in the first embodiment, one pair of the expanding portions BP1 and BP2 is formed for every two light-receiving surface side fine-line electrodes 30A. However, in the modification, one pair of the expanding portions BP1 and BP2 are formed for every three light-receiving surface side fine-line electrodes 30A. Accordingly, a decrease in the area of the light-receiving surface of the solar cell 10 can be suppressed.

Second Modification of First Embodiment

Hereinafter, a second modification of the first embodiment is described by referring to the drawings. In the following description, points different from the first embodiment are mainly described. Specifically, in the modification, the description is given of a case where a plurality of connecting wires formed in one direction are arranged in the arrangement direction.
(Configuration of Solar Cell)

The configuration of the solar cell 10 according to the modification is described by referring to FIG. 9. FIG. 9(a) is a plan view of the solar cell 10 viewed from the light-receiving surface side. FIG. 9(b) is a plan view of the solar cell 10 viewed from the back surface side. Note that, the connecting wire group 37A and the connecting wire group 37B in the modification have the same configurations. Thus, only the connecting wire group 37A is mainly described below.

The connecting wire group 37A is formed on the light-receiving surface FS of the photoelectric conversion body 25. The connecting wire group 37A has a plurality of end portions expanding toward the outside of the connection region R1, as shown in FIG. 9(a). The plurality of end portions are formed in the arrangement direction in the outside of the connection region R1. With this configuration, the connecting wire group 37A has a function to support the wiring member 20a when the wiring member 20a is disposed in a position off-centered of the connection region R1. Note that each end portion is an expanding portion of a connecting wire 371 to be described later.
(Configurations of Connecting Wire Group 37A and Light-Receiving Surface Side Fine-Line Electrode 31A)

The configurations of the connecting wire group 37A and the light-receiving surface side fine-line electrode 31A are described by referring to FIG. 10. FIG. 10 is an enlarged view of portion E in FIG. 9.

As shown in FIG. 10, the connecting wire group 37A is formed of a plurality of connecting wires 371. Each of the connecting wires 371a to 371c is formed in a left diagonal direction, and the plurality of connecting wires 371 are arranged in the arrangement direction. Each connecting wire 371 is electrically connected to three light-receiving surface side fine-line electrodes 31A. Specifically, the connecting wire 371a is electrically connected to the three light-receiving surface side fine-line electrodes $31A_1$ to $31A_3$. Similarly, the connecting wire 371b is electrically connected to the light-receiving surface side fine-line electrodes $31A_3$ to $31A_5$.

Similar to the above-described first embodiment and first modification, the connecting wire group 37A also has a function to maintain an electrical connection between the wiring member 20a and the light-receiving surface side fine-line electrodes 30A having a poor direct connection with the wiring member 20a. However, it should be noted that, in the modification, the inclination of the left diagonal direction with respect to the orthogonal direction is larger than that of the first embodiment.

Also, as shown in FIG. 10, a wider width portion 31 is formed in portions of a light-receiving surface side fine-line electrode 31A, where the expanding portions BP1 and BP2 are connected. The wider width portion 31 is formed so as to extend from a position where the expanding portion BP1 or BP2 is connected to the connection region R1. In the modification, one end of the wider width portion 31 is formed so as to enter the inside of the connection region R1. However, the one end of the wider width portion 31 does not have to enter the inside of the connection region R1. The wider width portion 31 is only needed to be formed so as to come in direct contact with the wiring member 20a.

A line width $\alpha 2'$ of the wider width portion 31 is wider than the line width $\alpha 2$ of the light-receiving surface side fine-line electrode 31A. In addition, it is preferable that the line width $\alpha 2'$ of the wider width portion 31 be equal to or wider than the line-width $\alpha 1$ of the connecting wire 371.

Advantageous Effects

The modification can exert effects similar to those of the first embodiment and the first modification of the first embodiment.

Moreover, the light-receiving surface side fine-line electrodes $31A_1$, $31A_3$, and $31A_5$ according to the modification include a wider width portion 31 formed so as to extend from the position where the expanding portion BP2 is connected to the connection region R1. The line width $\alpha 2'$ of the wider width portion 31 is wider than the line width $\alpha 2$ of the light-receiving surface side fine-line electrode 31A.

Here, for example, if a direct connection between the wiring member 20a and the light-receiving surface side fine-line electrodes $31A_1$ to $31A_4$ becomes poor, an electric current flows through the light-receiving surface side fine-line electrode $31A_5$ from the light-receiving surface side fine-line electrodes $31A_1$ to $31A_4$ through the connecting wires 371a and 371b. In this case, the light-receiving surface side fine-line electrode 31A according to the modification includes the wider width portion having the line width $\alpha 2'$ wider than the line width $\alpha 2$. Thus, the good electric current can be maintained between the connecting wire 371b and the wiring member 20a.

Also, in the modification, one end of the wider width portion 31 is formed so as to enter the inside of the connection region R1. Accordingly, the one end of the wider width portion 31 is caused to cave in the wiring member 20a, so that a direct connection between the wiring member 20a and the light-receiving surface side fine-line electrode $31A_1$ can be further strengthened.

Second Embodiment

Hereinafter, a second embodiment of the present invention is described by referring to the drawings. In the following description, points different from the first embodiment are mainly described. Specifically, in the second embodiment, the description is give of a case where two connecting wires 351 are connected to two light-receiving surface side fine-line electrodes 30A.
(Configuration of Solar Cell)

Figure 11:
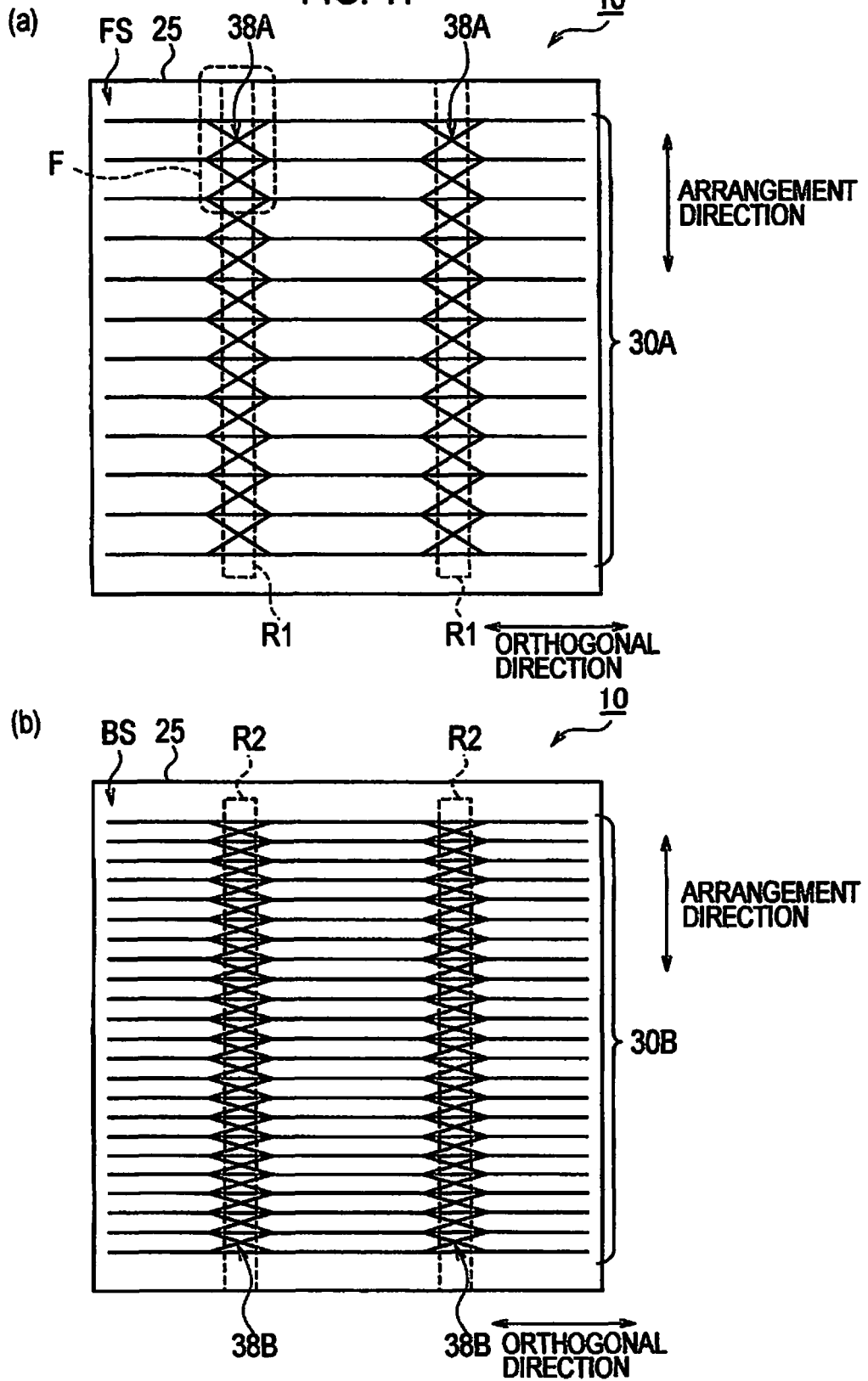
FIG. 11 shows plan views of a solar cell 10 according to a second embodiment of the present invention.

The configuration of the solar cell 10 according to the second embodiment is described by referring to FIG. 11. FIG. 11(a) is a plan view of the solar cell 10 viewed from the light-receiving surface side. FIG. 11(b) is a plan view of the solar cell 10 viewed from the back surface side. Note that, the connecting wire group 38A and the connecting wire group 38B according to the second embodiment have the same configurations. Thus, only the connecting wire group 38A is mainly described below.

As shown in FIG. 11(a), in a plan view of the light-receiving surface FS, the connecting wire group 38A is formed in a mesh form in the arrangement direction. The connecting wire group 38A has a plurality of expanding portions having a bent shape outside the connection region R1.

(Configuration of Connecting Wire Group 38A)

Figure 12:
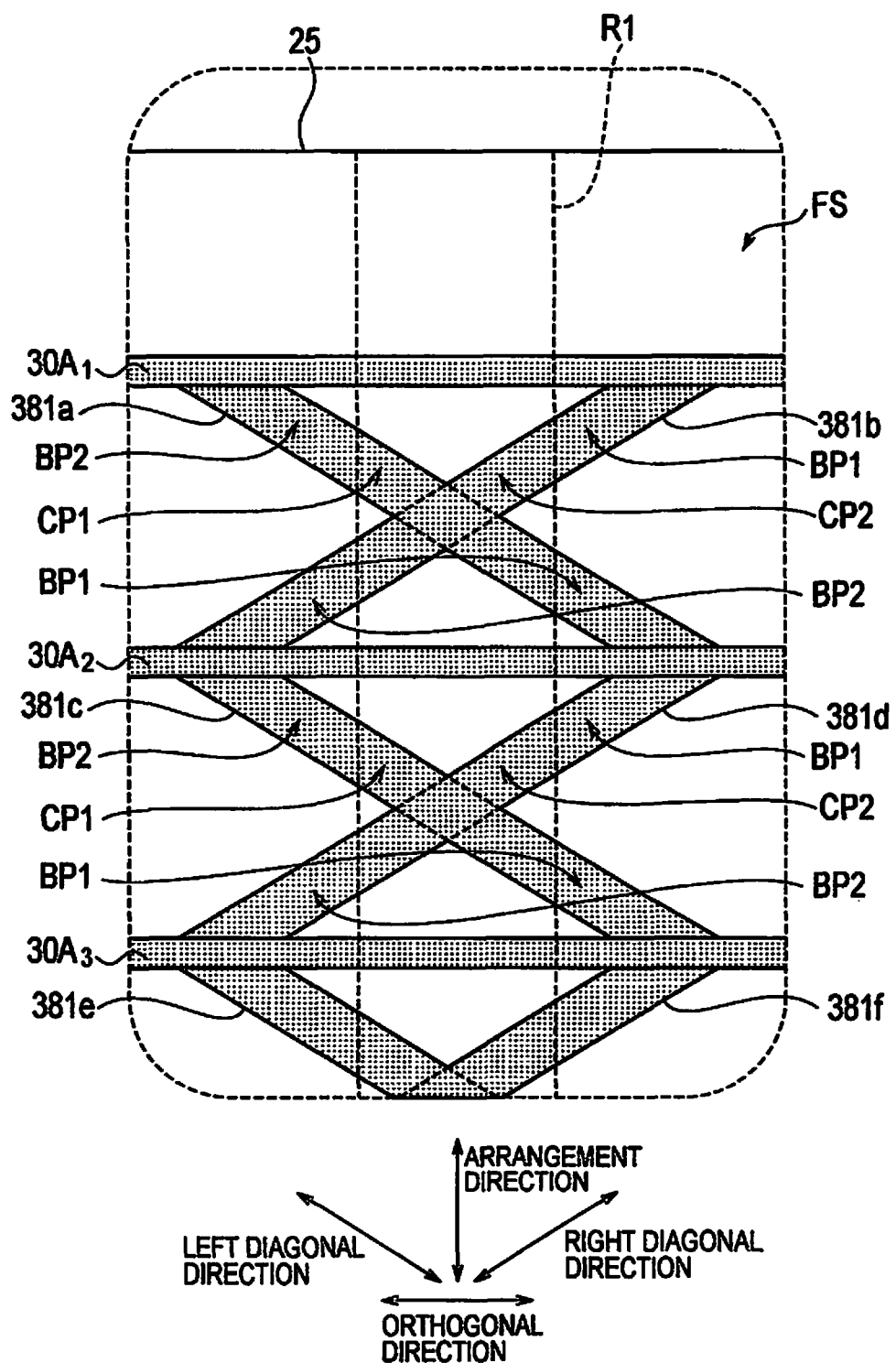
FIG. 12 is an enlarged view of portion F in FIG. 11.

The configuration of the connecting wire group 38A is described by referring to FIG. 12. FIG. 12 is an enlarged view of portion F in FIG. 11.

The connecting wires 381a and 381b are electrically connected to the light-receiving surface side fine-line electrodes $30A_1$ and $30A_2$. The connecting wire 381a is formed in the right diagonal direction and the connecting wire 381b is formed in a left diagonal direction. Similarly, the connecting wires 381c and 381d are electrically connected to the light-receiving surface side fine-line electrodes $30A_2$ and $30A_3$. The connecting wire 381c is formed in the right diagonal direction and the connecting wire 381d is formed in a left diagonal direction.

In the embodiment, as shown in FIG. 11(a) and FIG. 12, the plurality of connecting wires 381 are connected in mesh form to form the connecting wire group 38A. With this configuration, the light-receiving surface side fine-line electrodes 30A are electrically connected to each other through the connecting wire group 38A.

Advantageous Effects

The connecting wire 381 according to the second embodiment can exert effects similar to those of the connecting wire 351 according to the first embodiment.

For example, in the embodiment, the two light-receiving surface side fine-line electrodes $30A_1$ and $30A_2$ are electrically connected through the two connecting wires 381a and 381b. Accordingly, in the case where the direct contact between the wiring member 20a and the light-receiving surface side fine-line electrode $30A_1$ becomes poor, an electrical connection between the light-receiving surface side electrodes $30A_1$ and $30A_2$, i.e., an electrical connection between the light-receiving surface side fine-line electrode $30A_1$ and the wiring member 20a can be further made better.

Moreover, the embodiment can cause a covered portion CP of each of the two connecting wires 381a and 381b to cave in the wiring member 20a. Accordingly, the direct contact between the wiring member 20a and the light-receiving surface side fine-line electrode $30A_1$ can be further strengthened.

First Modification of Second Embodiment

Hereinafter, a first modification of the second embodiment is described by referring to the drawings. In the following description, points different from the second embodiment are mainly described. Specifically, in the modification, the description is given of a case where each of two connecting wires to be connected to two light-receiving surface side fine-line electrodes has one expanding portion.

(Configuration of Solar Cell)

Figure 13:
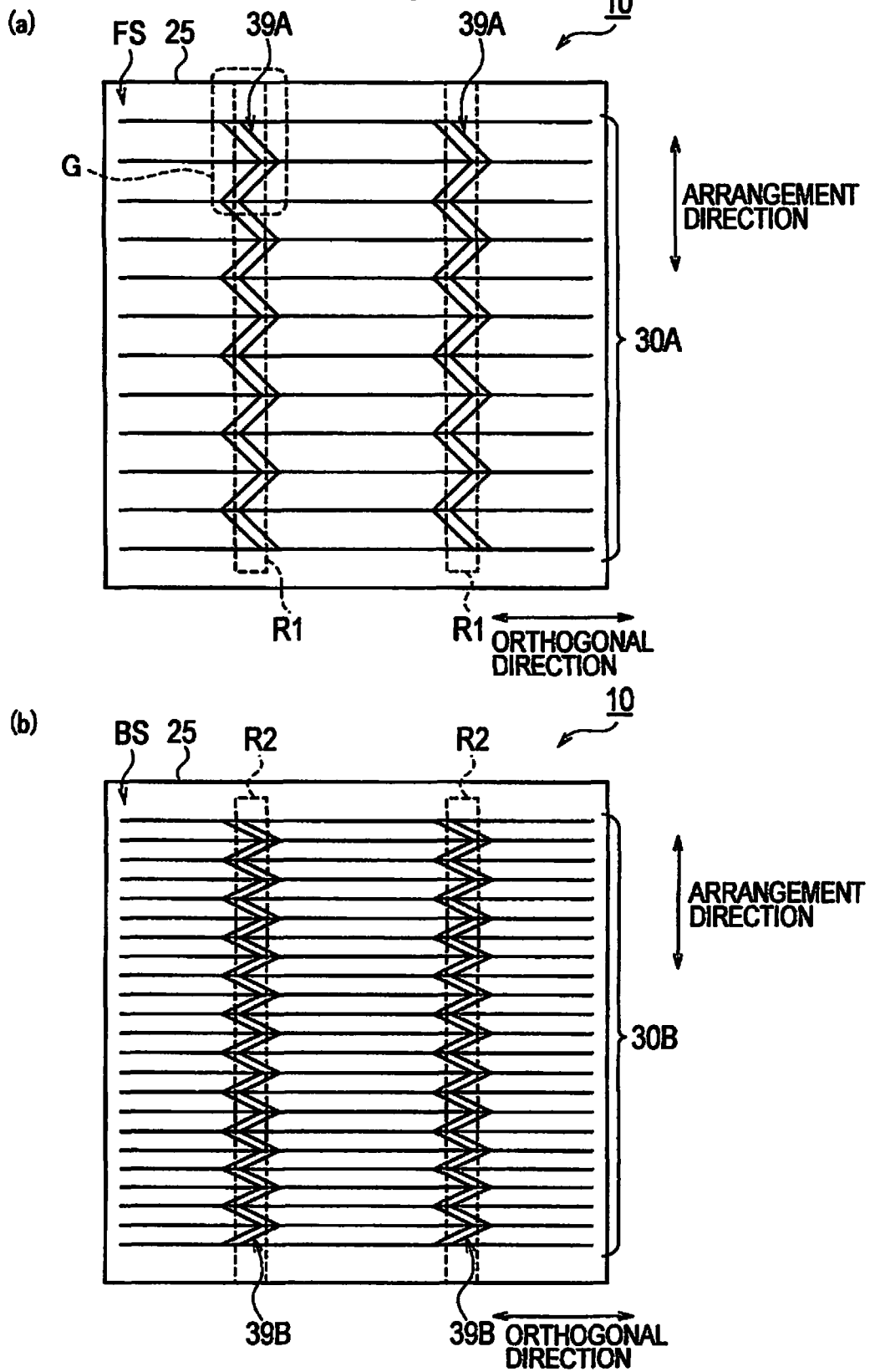
FIG. 13 shows plan views of a solar cell 10 according to a first modification of the second embodiment of the present invention.

The configuration of the solar cell 10 according to the modification is described by referring to FIG. 13. FIG. 13(a) is a plan view of the solar cell 10 viewed from the light-receiving surface side. FIG. 13(b) is a plan view of the solar cell 10 viewed from the back surface side. Note that, the connecting wire group 39A and the connecting wire group 39B in the modification have the same configurations. Thus, only the connecting wire group 39A is mainly described below.

As shown in FIG. 13(a), in a plan view of the light-receiving surface FS, the connecting wire group 39A is formed in two lines in a zigzag manner in the arrangement direction.

(Configuration of Connecting Wire Group 39A)

Figure 14:
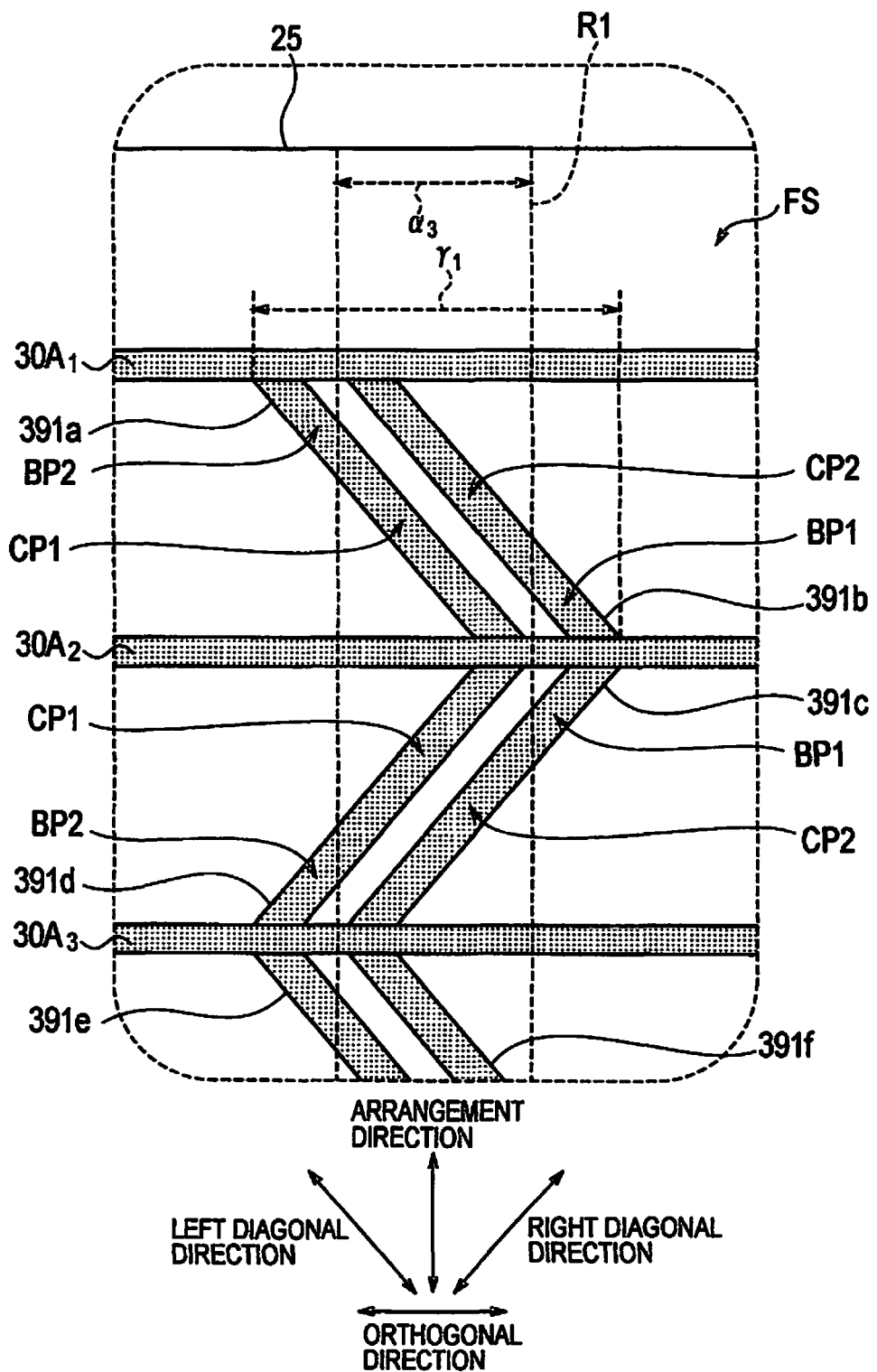
FIG. 14 is an enlarged view of portion G in FIG. 13.

The configuration of the connecting wire group 39A is described by referring to FIG. 14. FIG. 14 is an enlarged view of portion G in FIG. 13.

The connecting wires 391a and 391b are electrically connected to the light-receiving surface side fine-line electrodes $30A_1$ and $30A_3$. The connecting wires 391a and 391b are formed in parallel in the right diagonal direction. Similarly, the connecting wires 391c and 391d are electrically connected to the light-receiving surface side fine-line electrodes $30A_2$ and $30A_3$. The connecting wires 391c and 391d are formed in parallel in a left diagonal direction. However, it should be noted that, in the modification, the inclinations of the right diagonal direction and the left diagonal direction with respect to the orthogonal direction are larger than that of the second embodiment.

In addition, a formation width y1 (e.g., approximately 2.0 mm) in which the connecting wires 391a and 391b are formed in the orthogonal direction is larger than the width α3 of the connection region R1.

Advantageous Effects

The modification can exert effects similar to those of the second embodiment. In the above-described second embodiment, two pairs of the expanding portions BP1 and BP2 are formed for every two light-receiving surface side fine-line electrodes 30A. However, in the modification, only one pair of the expanding portions BP1 and BP2 is formed for every two light-receiving surface side fine-line electrodes 30A. Accordingly, a decrease in the area of the light-receiving surface of the solar cell 10 can be suppressed.

In addition, a formation width γ1 in which the connecting wires 391a and 391b are formed is larger than the width α3 of the connection region R1, so that the accuracy (tolerance) in the disposed position of the wiring member 20a can have a margin.

Moreover, the connecting wire 391 has only one expanding portion. Accordingly, the inclination of the connecting wire 391 with respect to the orthogonal direction can be set larger than the inclination of the connecting wire 381 according to the second embodiment with respect to the orthogonal direction. In this manner, the direction in which the connecting wire 391 extends can be brought closer to the arrangement direction, so that an amount of using the conductive paste can be reduced. As a result, the cost of manufacturing the solar cell 10 can be reduced, and the stress caused in an interface between the connecting wire 391 and the photoelectric conversion body 25 can be made smaller than the stress caused in an interface between the connecting wire 351 and the photoelectric conversion body 25.

Third Embodiment

Hereinafter, a third embodiment of the present invention is described by referring to the drawings. In the following description, portions different from the first embodiment are mainly described. Specifically, in the third embodiment, the description is given of a case where intersection points between light-receiving surface side fine-line electrodes and connecting wires are provided on a substantially straight line inside a connection region.

(Configuration of Solar Cell)

The configuration of the solar cell 10 according to the third embodiment is described by referring to FIG. 15. FIG. 15(a) is a plan view of the solar cell 10 viewed from the light-receiving surface side. FIG. 15(b) is a plan view of the solar cell 10 viewed from the back surface side. Note that, the connecting wire group 40A and the connecting wire group 40B according to the third embodiment have the same configurations. Thus, only the connecting wire group 40A is mainly described below.

As shown in FIG. 15(a), in a plan view of the light-receiving surface FS, the connecting wire group 40A is formed in a zigzag manner in the arrangement direction.

(Configuration of Connecting Wire Group 40A)

Figure 16:
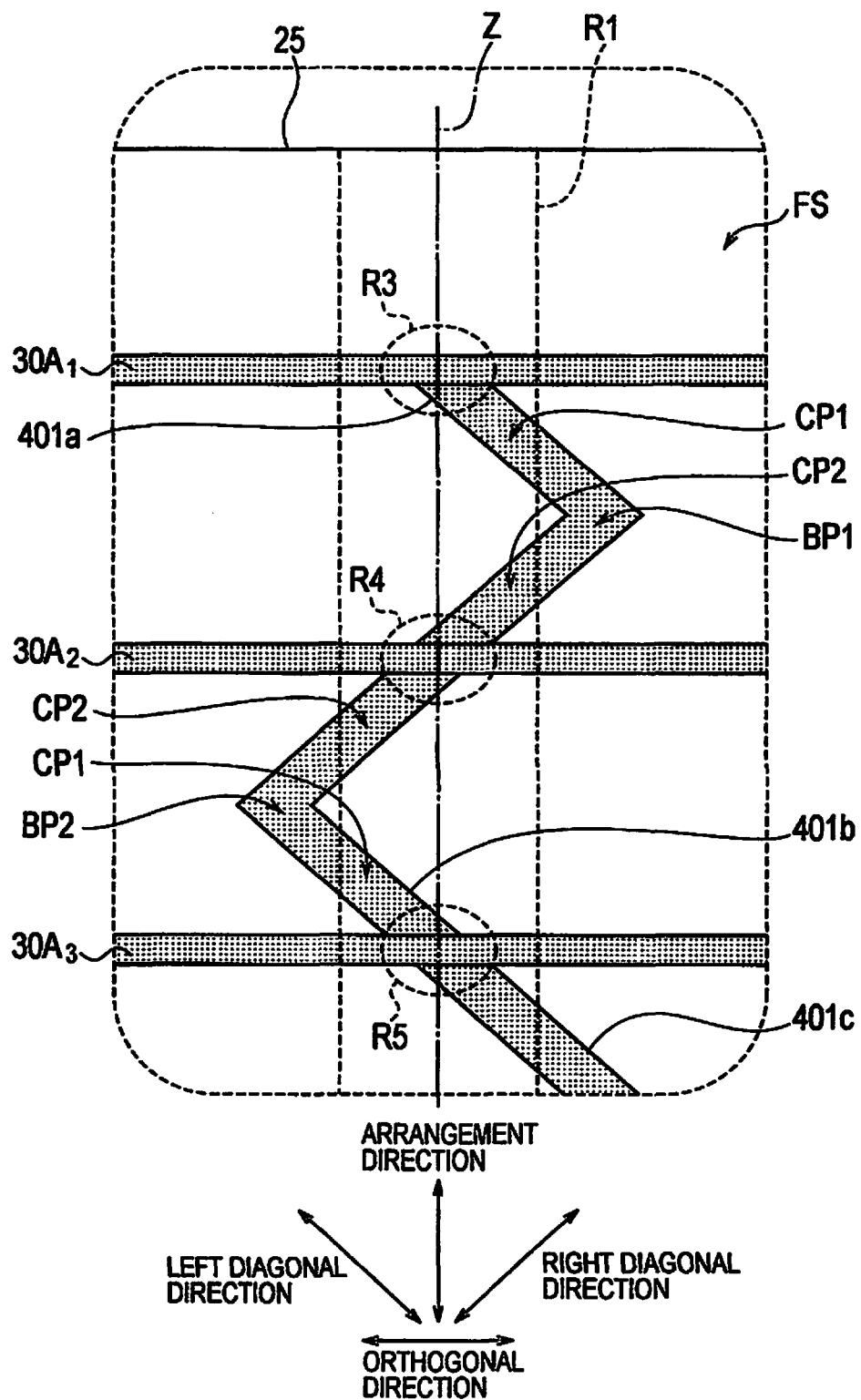
FIG. 16 is an enlarged view of portion H in FIG. 15.

The configuration of the connecting wire group 40A is described by referring to FIG. 16. FIG. 16 is an enlarged view of portion H in FIG. 15.

The connecting wire 401a is electrically connected to the light-receiving surface side fine-line electrodes $30A_1$ and $30A_2$. Similarly, the connecting wire 401b is electrically connected to the light-receiving surface side fine-line electrodes $30A_2$ and $30A_3$.

And now, an intersection region R3 in which the connecting wire 401a intersects with the light-receiving surface side fine-line electrode $30A_1$; an intersection region R4 in which the connecting wire 401a and the connecting wire 401b intersect with the light-receiving surface side fine-line electrode $30A_3$; and an intersection region R5 in which the connecting wire 401b and the connecting wire 401c intersect with the light-receiving surface side fine-line electrode $30A_3$, are provided on a substantially straight line in the arrangement direction within the connection region R1.

Advantageous Effects

The connecting wire 401 according to the third embodiment can exert effects similar to those of the connecting wire 351 according to the first embodiment.

Moreover, in the embodiment, the intersection region in which each connecting wire 401 intersects with the corresponding light-receiving surface side fine-electrode 30A is provided in the arrangement direction. Accordingly, the measuring accuracy of the I-V characteristic inspection on the solar cell 10 can be improved. In the following description, the improvement of the measuring accuracy is described by referring to the drawings.

Figure 17:
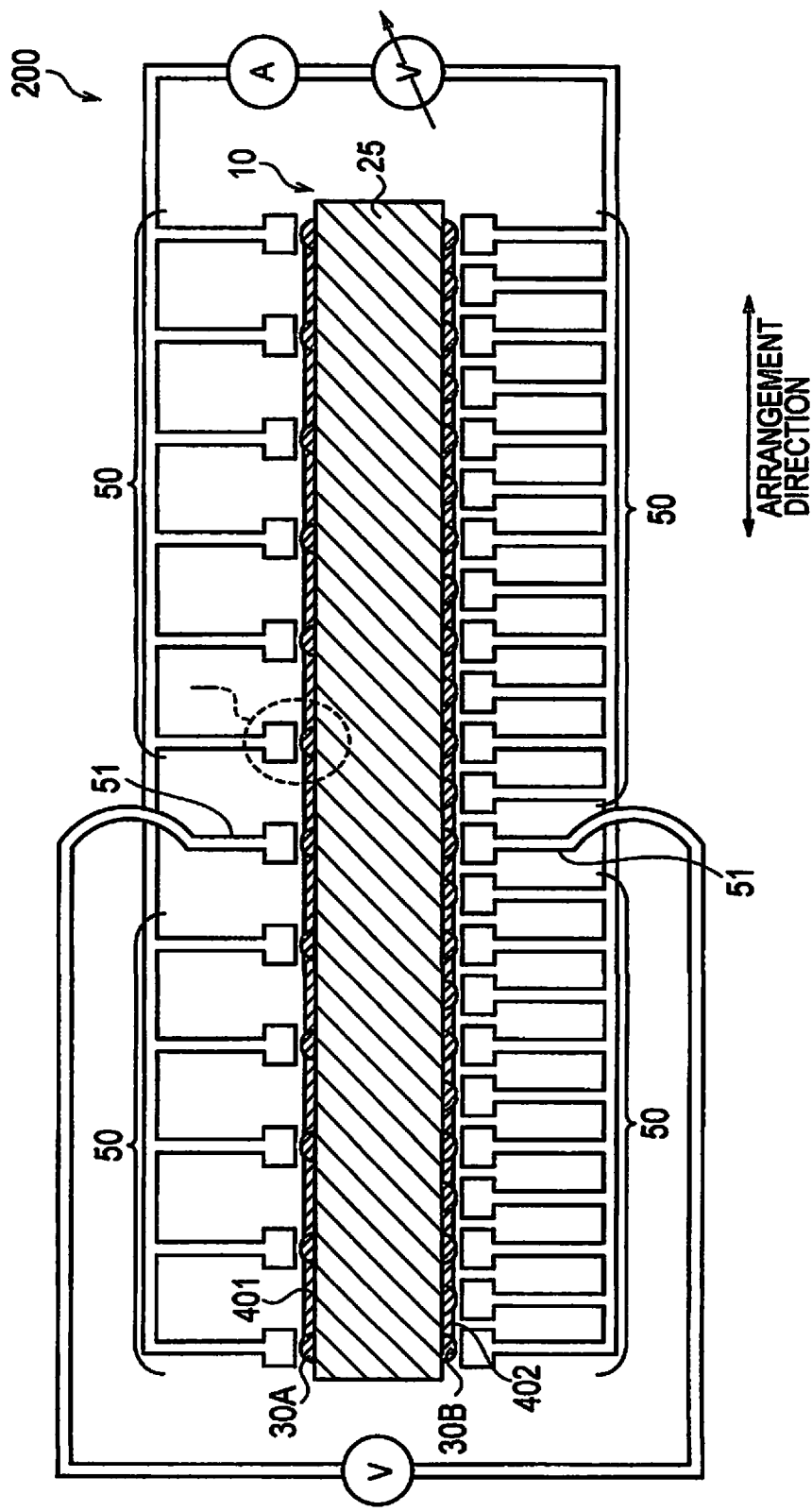
FIG. 17 is a diagram of an I-V characteristic inspection device 200.

FIG. 17 is a diagram of an I-V characteristic inspection device 200. A current measuring probe pin 50 is brought into contact with each light-receiving surface side fine-line electrode 30A and the back surface side fine-line electrode 30B. Note that one pair of voltage measuring probe pins 51 is brought into contact with one pair of the light-receiving surface side fine-electrode 30A and the back surface side fine-line electrode 30B. The plurality of current measuring probe pins 50 and the voltage measuring probe pins are arranged on a straight line in the arrangement direction.

The I-V characteristics of the solar cell 10 can be obtained by measuring a current and voltage when a voltage to be applied to the solar cell 10 is swept while the light-receiving surface FS of the solar cell 10 is being irradiated with quasi-sunlight. This method of measuring the I-V characteristics is referred to as "four-terminal measuring method".

Figure 18:
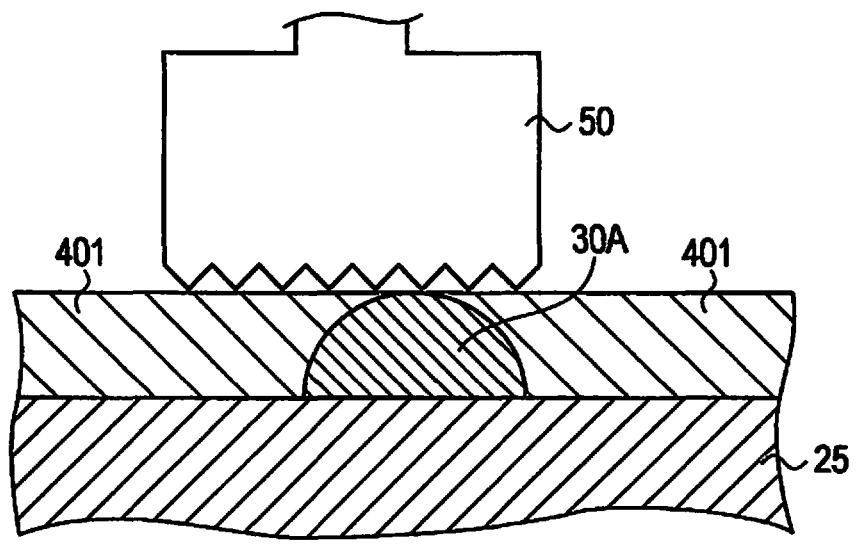
FIG. 18 is an enlarged view of portion I in FIG. 17.
Figure 19:
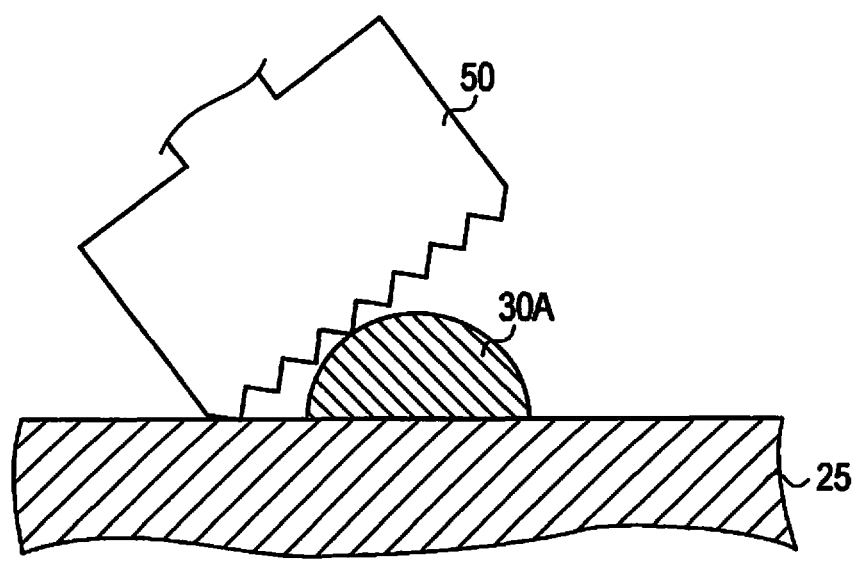
FIG. 19 is a diagram showing a state where a contact between a current measuring probe pin 50 and a light-receiving surface side fine-line electrode 30 is poor.

FIG. 18 is an enlarged view of portion I in FIG. 17. As shown in FIG. 18, in the embodiment, the current measuring probe pin 50 can be brought into contact with the light-receiving surface side fine-line electrode 30A in the intersection region where the connecting wire 401 and the light-receiving surface side fine-line electrode 30A intersect with each other. Accordingly, for example, even when positions of the current measuring probe pin 50 and the light-receiving surface side fine-line electrode 30A are off-centered of each other, the contact between the current measuring probe pin 50 and the light-receiving surface side fine-line electrode 30A can be properly maintained. On the other hand, in a case where the current measuring probe pin 50 is brought into contact only with the light-receiving surface side fine-line electrode 30A, if the positions of the current measuring probe pin 50 and the light-receiving surface side fine-line electrode 30A are off-centered of each other, as shown in FIG. 19, a contact defect is caused between the current measuring probe pin 50 and the light-receiving surface side fine-line electrode 30A. As a result, the accuracy in measuring the I-V characteristic is decreased.

In the embodiment, the intersection regions in which the connecting wires 401 and the light-receiving surface side fine-line electrodes 30A intersect with each other are provided on a straight line within the connection region R1. Accordingly, the current measuring probe pin 50 and the voltage measuring probe pin 51 can be brought into good contact with every light-receiving surface side fine-line electrode 30A. As a result, the measurement accuracy of the I-V characteristic inspection on the solar cell 10 can be improved.

Moreover, in the embodiment, the connecting wire 401a intersects in the intersection region R3 with the light-receiving surface side fine-line electrode $30A_1$ which is the closest among the plurality of light-receiving surface side fine-line electrodes 30A to the adjacent solar cell 10. Accordingly, this can improve the adhesion strength between a portion where a load is most easily gathered in the wiring member 20a and the light-receiving surface side fine-line electrode 30A. As a result, a decreased in a carrier collecting efficiency of the solar cell 10 can be suppressed.

Note that effects similar to those obtained by the four-terminal measuring method can be also obtained when the two-terminal measuring method is used.

Fourth Embodiment

Hereinafter, a fourth embodiment of the present invention is described by referring to the drawings. In the following description, points different from the first embodiment are mainly described. Specifically, in the fourth embodiment, the description is given of a case where a wiring member 20 and each light-receiving surface side fine-line electrode 30A are soldered.

(Configuration of Solar Cell)

Figure 20:
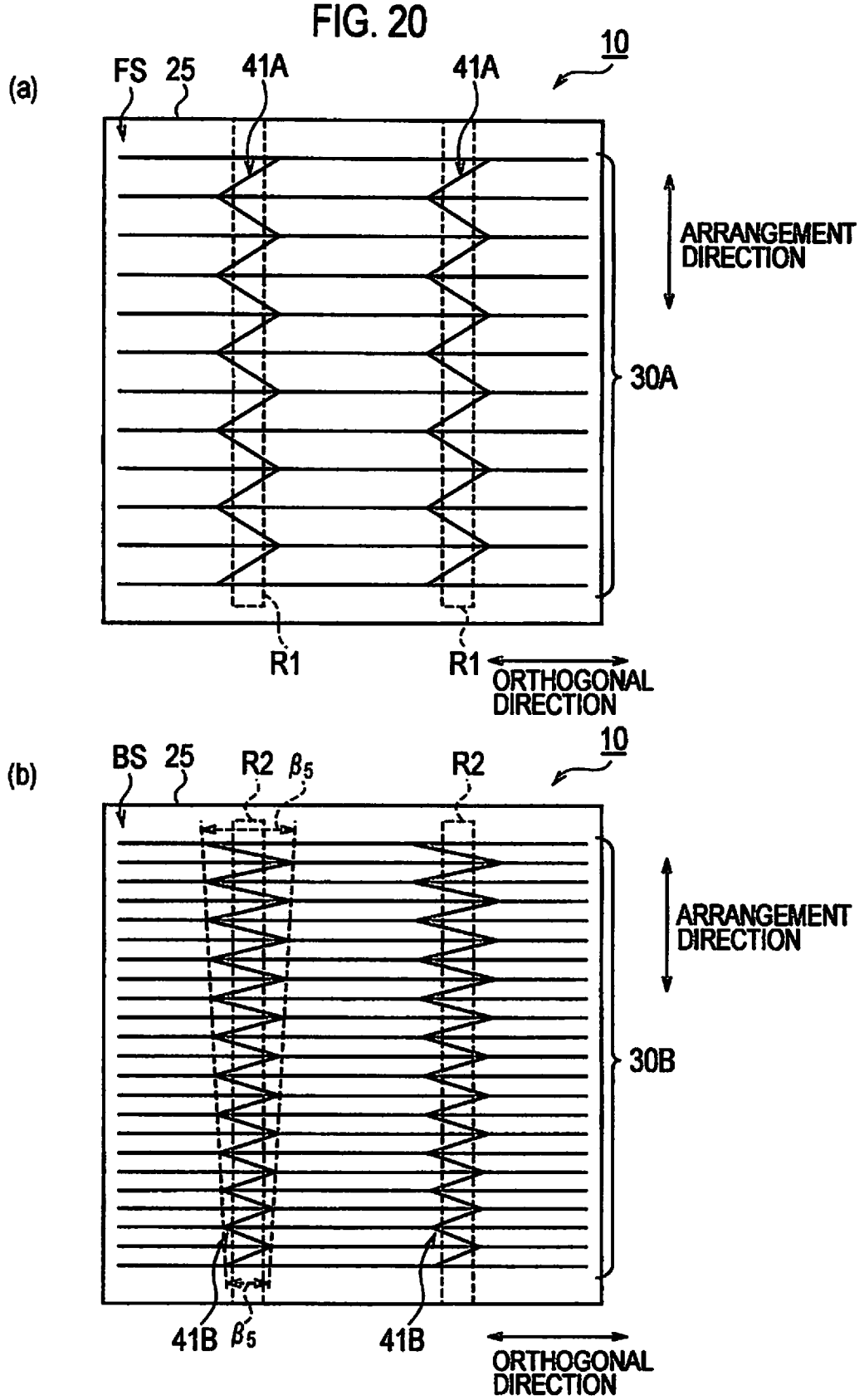
FIG. 20 shows plan views of a solar cell 10 according to a fourth embodiment of the present invention.

The configuration of the solar cell 10 according to the fourth embodiment is described by referring to FIG. 20. FIG. 20(a) is a plan view of the solar cell 10 viewed from the light-receiving surface side. FIG. 20(b) is a plan view of the solar cell 10 viewed from the back surface side.

A solar cell 10 according to the fourth embodiment includes a connecting wire group 41A and a connecting wire group 41B.

The connecting wire group 41A has the same configuration as that of the connecting wire group 35A according to the first embodiment. Thus, a formation width in which the connecting wire group 41A is formed is the formation width α4 of the connecting wire 351 according to the first embodiment.

On the other hand, the connecting wire group 41B has the configuration different from that of the connecting wire group 35B according to the first embodiment. Specifically, as shown in FIG. 20(b), a formation width β5 of the connecting wire group 41B in the orthogonal direction is formed so as to be gradually widened in the arrangement direction. On end portion of the wiring member 20b is connected to a wider portion of the formation width β5 in the connecting wire group 41B.

In the embodiment, on one side of an adjacent solar cell 10, the formation width β5 of the connecting wire group 41B is equal to the formation width β4 of the connecting wire 352 according to the first embodiment. On the other hand, on the other side of the adjacent solar cell 10, the formation width β5 of the connecting wire group 41B is larger than the formation width β4 of the connecting wire 352. In other words, the formation width β5 of the connecting wire group 41B is formed so as to greatly expand from the connection region R2 as the connecting wire group 41B goes from one end toward the other end in the arrangement direction thereof.

(Method of Manufacturing Solar Cell Module)

Hereinafter, a method of manufacturing the solar cell module 100 according to the embodiment is described.

(1) Process of Manufacturing the Solar Cell

First of all, a conductive paste such as a epoxy based thermosetting silver paste is arranged in a predetermined pattern on the light-receiving surface FS and back surface BS of the photoelectric conversion body 25 using a printing method such as a screen printing method or offset printing method. FIG. 20 shows the predetermined pattern.

Next, the conductive paste is dried under a predetermined condition, so that a light-receiving surface side fine-line electrode 30A, a back surface side fine-line electrode 30B, a connecting wire group 41A and a connecting wire group 41B are formed. Note that the formation width of the connecting wire group 41B is formed so as to be gradually widened in the arrangement direction.

(2) Process of Forming the Solar Cell String

First of all, as shown in FIG. 21(a), a wiring member is taken out from a bobbin around which a long wiring member is wound and then cut at a predetermined length. In doing so, a wiring member 20 is formed. Then, a stepped portion corresponding to a thickness of a solar cell 10 is provided in a substantially center portion of the wiring member 20.

After that, as shown in FIG. 21(b), one end portion of the wiring member 20 is soldered onto a light-receiving surface FS (a connection region R1) of a solar cell 10a. Note that this soldering is carried out with heat of a soldering iron or a hot blast.

Thereafter, as shown in FIG. 21(c), the other end portion of the wiring member 20 is soldered onto a back surface BS (a connection region R2) of a solar cell 10b. At this time, the one end portion of the wiring member 20 is fixed on the solar cell 10a, so that the other end portion of the wiring member 20 tends to be displaced in the orthogonal direction as a distance from the solar cell 10a (the adjacent solar cell 10) becomes longer. In particular, as shown in FIG. 21(c), the wiring member 20 moves more freely in the orthogonal direction in a second portion Q2 than a first portion Q1. As a result, the first portion Q1 tends to protrude outwardly from the connection region R2. However, it should be noted that, as described above, the connecting wire group 41B according to the embodiment greatly expands from the connection region R2 as a distance from the solar cell 10a (the adjacent solar cell 10) becomes longer.

(3) Modularization Process

After that, an EVA (sealing member 4) sheet, a solar cell string 1, an EVA (sealing member 4) sheet, and a PET sheet (back surface side protection member 3) are sequentially laminated on a glass substrate (light-receiving surface side protection member 2). EVA is heated under a predetermined condition to be cured.

Advantageous Effects

As described above, when the wiring member 20 is connected to the back surface BS of the solar cell 10, the end portion of the wiring member 20 tends to protrude from the connection region R2. However, the formation width of the connecting wire group 41B according to the embodiment is formed so as to greatly expand from the connection region R2 as a distance from the adjacent solar cell 10 becomes longer. Accordingly, the wiring member 20 and the connecting wire group 41B can be securely connected. This results in prevention of a decrease in the connection strength, which may be caused by the wiring member 20 running of from the connection region R2.

Fifth Embodiment

Hereinafter, a fifth embodiment of the present invention is described by referring to the drawings. In the following description, points different from the first embodiment are mainly described. Specifically, in the fifth embodiment, the description is given of a case where a formation region of a connecting wire group on a light-receiving surface FS side overlaps with a formation region of a connecting wire group on a back surface BS side and a width of a connecting wire on the back surface BS side is wider than a width of a connecting wire on the light-receiving surface FS side.

(Configuration of Solar Cell)

The configuration of the solar cell 10 according to the fifth embodiment is described by referring to FIG. 22. FIG. 22(a) is a plan view of the solar cell 10 viewed from the light-receiving surface side. FIG. 22(b) is a plan view of the solar cell 10 viewed from the back surface side.

As shown in FIG. 22(a), a connecting wire group 45A is formed in a zigzag manner on the light-receiving surface FS. The connecting wire group 45A has the same configuration as that of the connecting wire group 35A according to the first embodiment. In the embodiment, the connecting wire group 45A forms a first connecting wire group.

On the other hand, as shown in FIG. 22(b), similar to the connecting wire group 45A, a connecting wire group 45B is formed in a zigzag manner on the back surface BS of a photoelectric conversion body 25 positioned on the opposite side of the light-receiving surface FS. In the embodiment, the connecting wire group 45B forms a second connecting wire group.

The connecting wire group 45B is formed in a position corresponding to the position of the connecting wire group 45A. In other words, the formation region of the connecting wire group 45B overlaps with the formation region of the connecting wire group 45A. Furthermore, a width of a connecting wire 452 (unillustrated in FIG. 22(b), and see FIG. 23) forming the connecting wire group 45B is wider than a width of a connecting wire 451 (unillustrated in FIG. 22(a), and see FIG. 23) forming the connecting wire group 45A.

In addition, a connection region R1 of the light-receiving surface FS and a connection region R2 of the back surface BS are the same as those of the above-described first embodiment.

(Configurations of Connecting Wire Group 45A and 45B)

Figure 23:
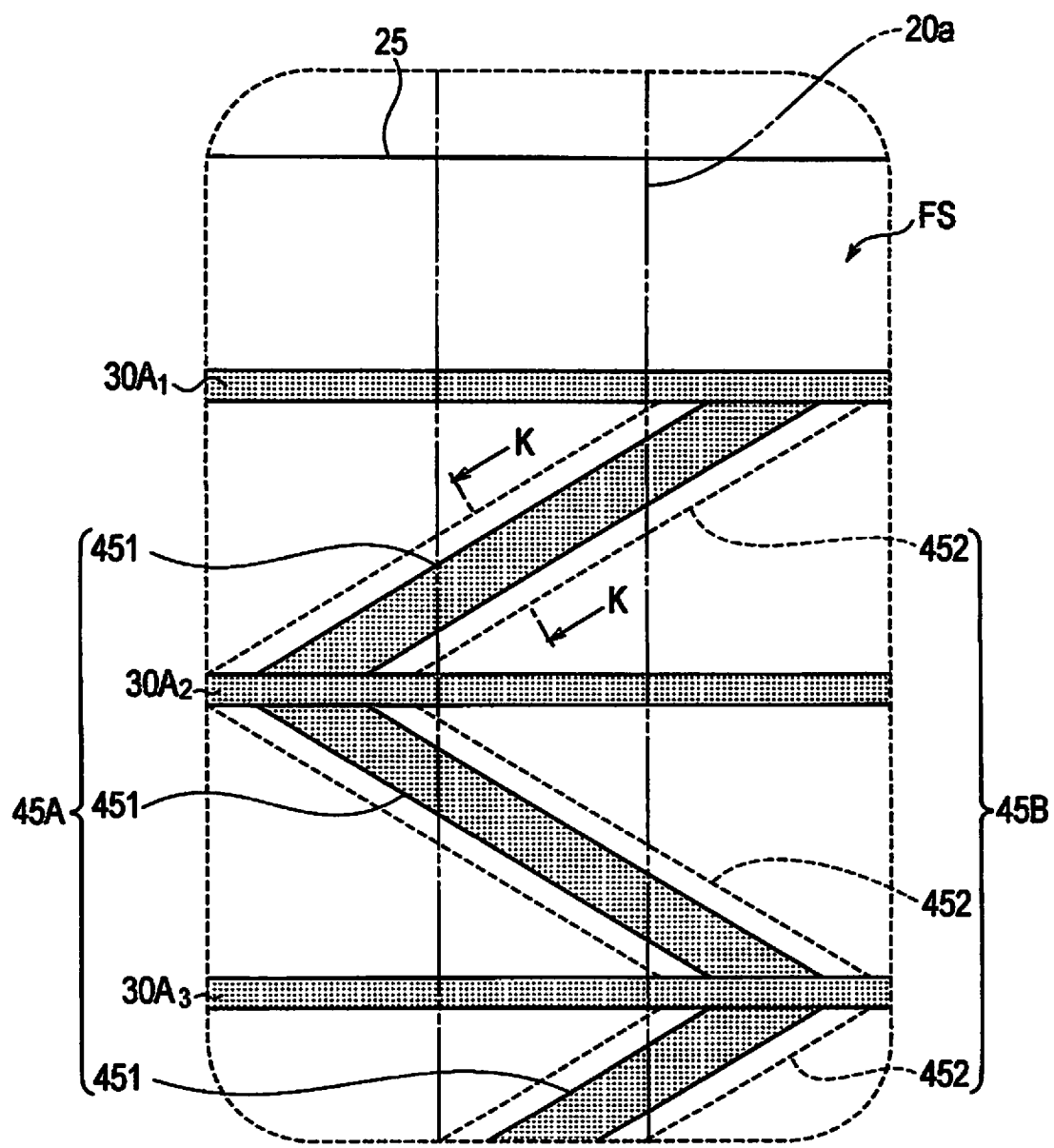
FIG. 23 is an enlarged view of portion J in FIG. 22.

The configurations of the connecting wire group 45A and 45B are described by referring to FIG. 23. FIG. 23 is an enlarged view of portion J in FIG. 22. As shown in FIG. 23, the connecting wire group 45A is formed of a plurality of connecting wires 451. Each connecting wire 451 is electrically connected to any of light-receiving surface side fine-line electrodes 30A. In the embodiment, the connecting wire 451 forms a first connecting wire.

Similarly, the connecting wire group 45B is formed of a plurality of connecting wires 452. Each connecting wire 452 is electrically connected to any of back surface side fine-line electrodes 30B (see FIG. 22(b)). In the embodiment, the connecting wire 452 forms a second connecting wire.

As described above, the connecting wire group 45A and the connecting wire group 45B are formed in substantially the same zigzag manner, except that widths of the connecting wires are different. In addition, the formation region of the connecting wire group 45B completely overlaps with the formation region of the connecting wire group 45A of the solar cell 10. In other words, the formation region of the connecting wire group 45A is included in the formation region of the connecting wire group 45B in a plan view of the photoelectric conversion body 25.

Figure 24:
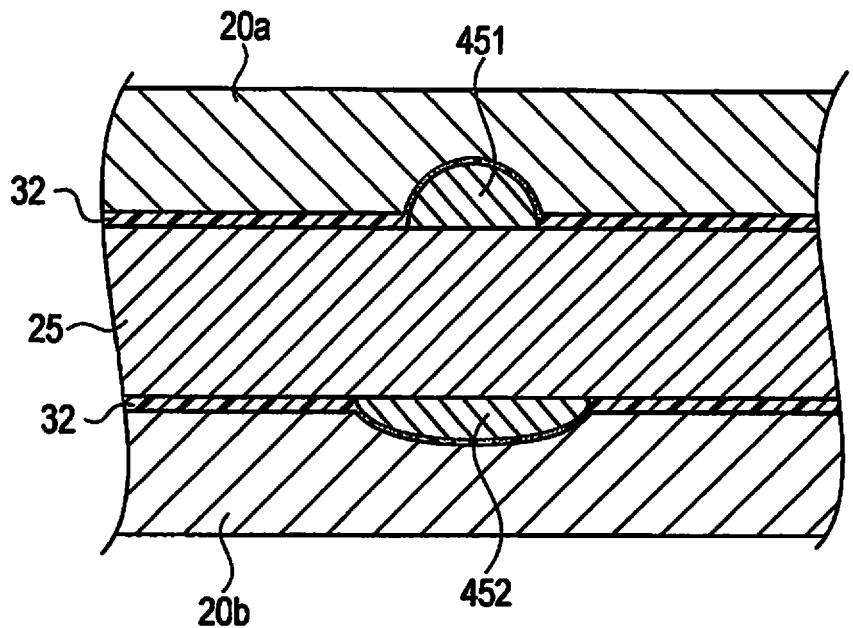
FIG. 24 is a cross-sectional view of the solar cell 10 taken along the K-K line in FIG. 23.
Figure 25:
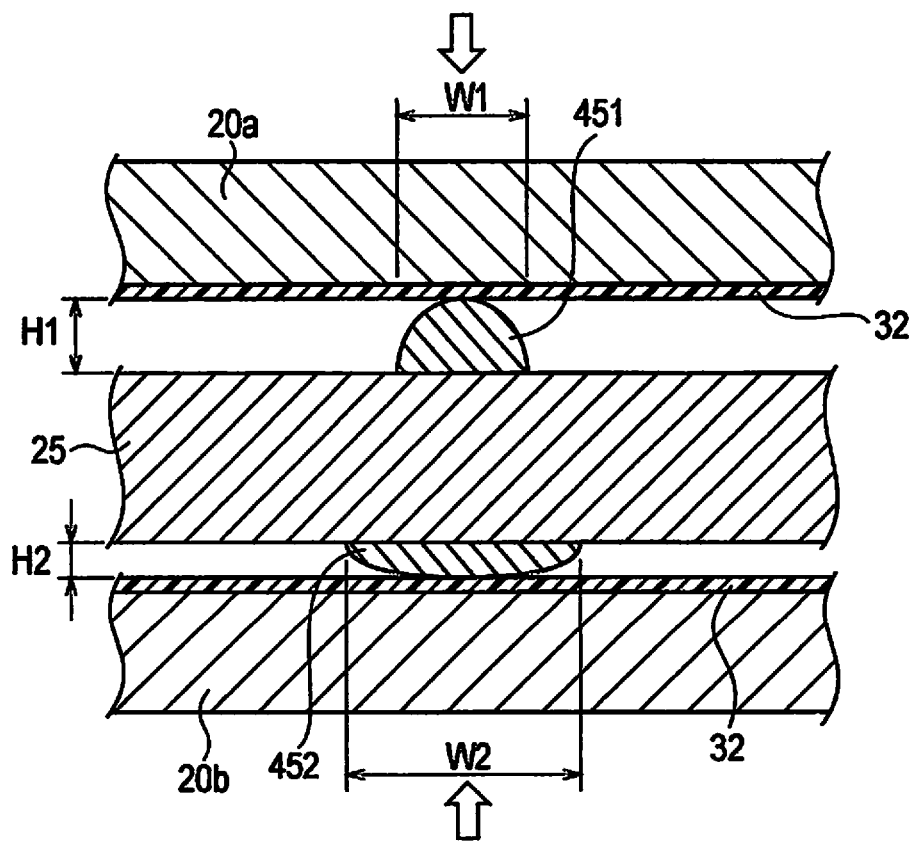
FIG. 25 is a cross-sectional view of the solar cell 10 before wiring members 20 are pushed onto and connected to a connecting wire 451 and a connecting wire 452.

FIG. 24 is a cross-sectional view of the solar cell 10 taken along the K-K line in FIG. 23. FIG. 25 is a cross-sectional view of the solar cell 10 taken along the K-K line in FIG. 23 before a wiring member 20 is pushed onto and connected to the connecting wires 451 and 452. As shown in FIGS. 24 and 25, the light-receiving surface FS including the wiring member 20a and the connecting wire 451 and the back surface BS including the wiring member 20b and the connecting wire 452 are bonded and electrically connected to each other with a resin adhesive 32. The resin adhesive 32 may be the same resin adhesive 32 according to the first embodiment. Note that it is preferable that the resin adhesive 32 contain conductive particles.

The width of the connecting wire 452 is wider than the width of the connecting wire 451. In the embodiment, the width W1 of the connecting wire 451 is set to be 100 μm and the width W2 of the connecting wire 452 is set to be 200 μM. In other words, the width W2 is double the width W1. Note that a width of a connecting wire means a width of a connecting wire in a direction orthogonal to an extending direction of the connecting wire.

In addition, a relationship between the width W1 and the width W2 is not necessarily about a double, but is only needed to be properly determined in consideration of a tolerance which is allowed when the connecting wire group 45A or 45B is printed on the light-receiving surface FS or back surface BS of the photoelectric conversion body 25. In general, it is preferable that the width W2 be set to be about four times the width W1 of the back surface side fine-line electrode 30B at the maximum in consideration of the allowable tolerance. In other words, when the width W1 is 100 μm, the width W2 may be about 400 μm at the maximum.

Furthermore, a height H1 of the connecting wire 451 in a thickness direction of the solar cell 10 is higher than a height H2 of the connecting wire 452. In the embodiment, the height H1 is set to be two to three times the height H2. Note that the height H1 may be about five times the height H2.

Note that it is preferable that the connecting wire group 45A be formed on the light-receiving surface FS of the photoelectric conversion body 25 which mainly receives light such as sunlight and the connecting wire group 45B be formed on the back surface BS of the photoelectric conversion body 25 whose amount of receiving light is smaller than the light-receiving surface FS. However, the configuration is not necessarily limited.

Advantageous Effects

The connecting wires 451 and 452 according to the fifth embodiment can exert effects similar to those of the connecting wire 351 according to the first embodiment.

In addition, in the embodiment, the formation region of the connecting wire group 45A is included in the formation region of the connecting wire group 45B in the plan view of the photoelectric conversion body 25. Furthermore, the width W2 of the connecting wire 452 is wider than the width W1 of the connecting wire 451. When the wiring member 20 is bonded to the photoelectric conversion body 25 using the resin adhesive 32, the wiring member 20 is pushed onto the photoelectric conversion body 25 from both sides of the light-receiving surface FS and the back surface BS (see arrows in FIG. 25).

Figure 26:
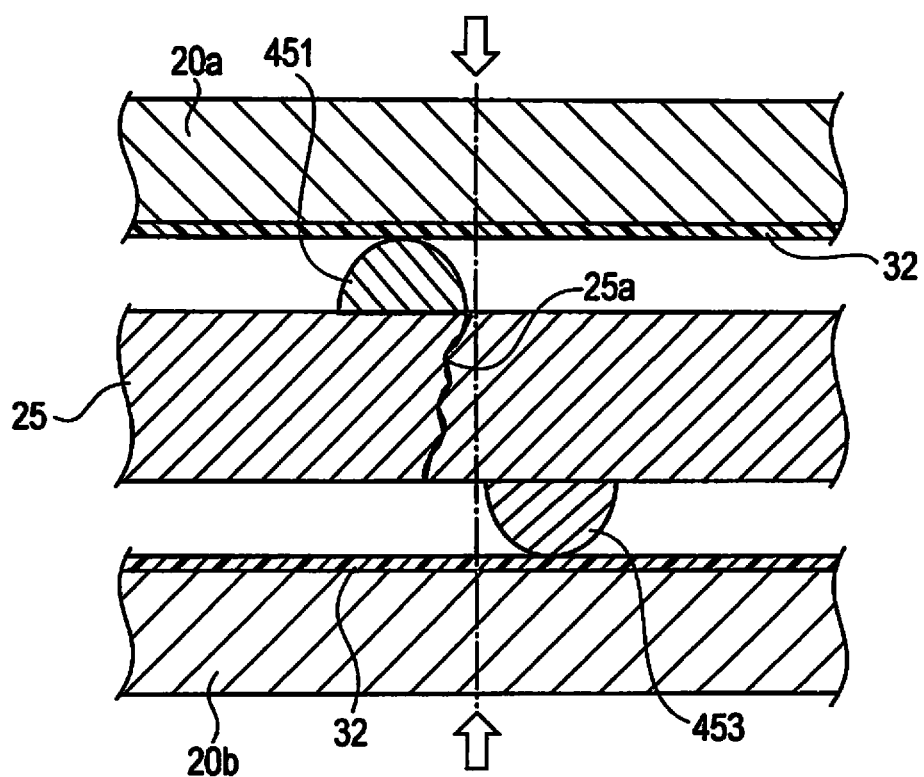
FIG. 26 is a cross-sectional view taken along the K-K line of the solar cell 10 having connecting wires with the same widths on a light-receiving surface FS side and a back surface BS side.

And now, FIG. 26 is a cross-sectional view of the solar cell 10 taken along the K-K line, the solar cell 10 having the connecting wires with the same widths on the light-receiving surface FS side and the back surface BS side. As shown in FIG. 26, there may be a case where the position of the connecting wire 451 and the position of the connecting wire 452 do not correspond to each other due to the above-described tolerance and are disposed in positions relatively off-centered of each other. When the wiring member 20 is pushed onto the photoelectric conversion body 25 from the both sides of the light-receiving surface FS and the back surface BS in the state where the connecting wires 451 and 452 are disposed in the positions relatively off-centered of each other, shearing stress is applied to the photoelectric conversion body 25. This may cause a crack 25a in the photoelectric conversion body 25.

The connecting wire 453 shown in FIG. 26 has a width equal to the width of the connecting wire 451. Thus, when the connecting wires 451 and 452 are disposed in positions relatively off-centered of each other, it is difficult to suppress the shearing stress applied to the photoelectric conversion body 25. On the other hand, the connecting wire 452 shown in FIG. 25 has a width which is two times or larger than the width of the connecting wire 451. Accordingly, even when the connecting wires 451 and 452 are disposed in the positions relatively off-centered of each other, the shearing stress applied to the photoelectric conversion body 25 can be suppressed by the connecting wire 452 having the wider width. As a result, a yield of the solar cell 10 can be improved.

Moreover, in the embodiment, the connecting wire 451 having a narrower width is formed on the light-receiving surface FS and the connecting wire 452 having a wider width is formed on the back surface BS. Accordingly, a decrease in the area of the light-receiving surface of the solar cell 10 can be suppressed and the occurrence of the crack 25a can be prevented.

In the embodiment, the height H1 of the connecting wire 451 is higher than the height H2 of the connecting wire 452. Accordingly, even when the width W2 of the connecting wire 452 is set to be wider than the width W1 of the connecting wire 451, electric conductivities (electrical resistivity) of the connecting wires 451 and 452 can be equally set.

Other Embodiments

The present invention has been described by using the above-described embodiments. However, it should not be understood that the description and drawings which constitute part of this disclosure limit the present invention. From this disclosure, various alternative embodiments, examples, and operation techniques will be easily found by those skilled in the art.

For example, in the above-described embodiments, a connecting wire has two expanding portions. However, a connecting wire may have only one expanding portion. For example, when a device in which a displacement of a wiring member 20 is limited only to one side of a connection region R, a connecting wire group may need to have a plurality of expanding portions BP1 only.

In the above-described embodiments, each connecting wire is electrically connected to a plurality of fine-line electrodes. However, each connecting wire may be electrically connected to one fine-line electrode.

In the above-described embodiments, a connecting wire group is electrically connected to all fine-line electrodes 30. However, the configuration is not limited to this configuration. The connecting wire group is only needed to have a plurality of expanding portions BP1 and BP2 to be formed on sides of the connection region R. With this configuration, the wiring member 20 is supported by the connecting wire group when the wiring member 20 is disposed in a position off-centered of the connection region R.

In the above-described embodiments, each connecting wire is linearly formed. However, the configuration is not limited to this configuration. For example, connecting wires may be formed in a curved shape or a shape including a curved portion.

In the above-described embodiments, a fine-line electrode is linearly formed. However, the fine-line electrode may be formed in a wave form or a zigzag manner. In particular, on the back surface side, a collector electrode (fine-line electrode) may be formed so as to entirely cover the back surface BS.

Moreover, in the above-described third embodiment, the configuration of the connecting wire group 40A is described using FIGS. 15 and 16. However, the configuration is not limited to that configuration. Specifically, as shown in FIGS. 27(a) to (c), even when connecting wire group 42A to 44A are used in place of the connecting wire group 40A, intersection points between light-receiving surface side fine-line electrodes and connecting wires are provided on a straight line.

Moreover, in the above-described third embodiment, the description is given by using "four-terminal measuring method" as an example. However, when a collector electrode is formed on the back surface BS side so as to entirely cover the surface of the back surface BS, a pair of current measuring probe pins 50 and a pair of voltage measuring probe pins 51 only need to be brought into contact with the collector electrodes.

As described above, the present invention naturally includes various embodiments which are not described herein. Accordingly, the technical scope of the present invention should be determined only by the matters to define the invention in the scope of claims regarded as appropriate based on the description.

Note that the entire content of Japanese Patent Application No. 2009-34653 (filed on Feb. 17, 2009) and Japanese Patent Application No. 2009-195376 (filed on Aug. 26, 2009) is incorporated herein by reference.

INDUSTRIAL APPLICABILITY

As described above, a solar cell and solar cell module according to the present invention that are prevented from having a deterioration in characteristics thereof, which may be caused by a crack in a photoelectric conversion body or the like, while avoiding an increase in the manufacturing cost, which is therefore useful in the field of manufacturing a solar cell and a solar cell module.

REFERENCE SIGNS LIST 1 solar cell string
2 light-receiving surface side protection member
3 back surface side protection member
4 sealing member
10 solar cell
20 wiring member
25 photoelectric conversion body
30A, 31A light-receiving surface side fine-line electrode
30B back surface side fine-line electrode
32 resin adhesive
35 to 46 connecting wire group
50 current measuring probe pin
51 voltage measuring probe pin
100 solar cell module
200 I-V characteristic inspection device
351, 352, 361, 371, 381, 391, 401, 451 to 453 connecting wire

The invention claimed is:

1. A solar cell having a wiring member for connection to another solar cell, the solar cell comprising:
a photoelectric conversion body; and connectors comprising:
a plurality of fine-line electrodes formed as printed lines of conductive material having a first width on a main surface of the photoelectric conversion body;
a connecting wire formed as printed lines of conductive material on the main surface of the photoelectric conversion body; and
a wiring member bonded with a resin adhesive and formed over the connecting wire and fine-line electrodes, wherein
the connecting wire has a fine-lined shape with a line width that is less than one third of the line width of the wiring member and having a main axis within a connection region and has a straight protruding portion that protrudes from under the connection region to one side of the connection region in the main surface to which the wiring member is connected, and
the protruding portion protrudes in an orthogonal direction neither perpendicular nor parallel to a longitudinal direction of the wiring member to the other side of the connection region, and wherein
two straight portions of the connecting wire meet to form an apex repeatedly on alternate sides of the connection region in a zig-zag pattern,
wherein the connecting wire is formed over the fine-line electrodes.

2. The solar cell according to claim 1, wherein the protruding wire portion outside of the connection region is electrically connected to at least one of the plurality of fine-line electrodes.

3. The solar cell according to claim 1, wherein
the connecting wire has a plurality of protruding wire portions, and
the plurality of protruding wire portions are dispersed in a longitudinal direction of the connection region.

4. The solar cell according to claim 1, wherein a lateral displacement of the connecting wire in the orthogonal direction is wider than a line width of the wiring member in the orthogonal direction.

5. The solar cell according to claim 1, wherein the plurality of fine-line electrodes electrically connect each other through the connecting wire.

6. The solar cell according to claim 1, wherein
the connecting wire includes a plurality of protruding wire portions, each electrically connected to at least one of the plurality of fine-line electrodes.

7. The solar cell according to claim 1, comprising
a first connecting wire formed on a first main surface of the photoelectric conversion body, and a second connecting wire formed on a second opposing main surface of the photoelectric conversion body, a formation region of the first connecting wire is included in a formation region of the second connecting wire in a plan view of the photoelectric conversion body, and a width of a second connecting wire forming the second connecting wire portion is wider than a width of a first connecting wire forming the first connecting wire portion.

8. The solar cell according to claim 7, wherein the first connecting wire is formed on a light-receiving surface of the photoelectric conversion body, the light-receiving surface mainly receiving light, and the second connecting wire is formed on a back surface of the photoelectric conversion body, the back surface receiving a less amount of light than the light-receiving surface.

9. The solar cell according to claim 7, wherein a height of the first connecting wire in a thickness direction of the solar cell is higher than a height of the second connecting wire.

10. A solar cell according to claim 1, wherein the resin adhesive is electrically conductive.

11. The solar cell of claim 1, wherein the connecting wire penetrates the wiring member surface to a depth greater than the depth of the fine-line electrodes penetration into the surface of the wiring member surface.

12. The solar cell of claim 1, wherein the line width of the connecting wire is between 100 and 250 microns.

13. The solar cell of claim 1, wherein each apex on one of the alternate sides extends past the connection region on the one of the alternate sides of the connection region, and wherein each apex on the other of the alternate sides extends past the connection region of the other of the alternate sides of the connection region.

14. A solar cell module including a solar cell sealed between a light-receiving surface side protection member and a back surface side protection member and to which a wiring member is connected, wherein the solar cell comprises:
 a photoelectric conversion body;
 a plurality of fine-line electrodes formed on a main surface of the photoelectric conversion body;
 a connecting wire formed over the fine-line electrodes on the main surface of the photoelectric conversion body and connected to the fine-line electrodes, and
 a wiring member bonded with a resin adhesive and formed over the connecting wire and fine-line electrodes on the main surface of the photoelectric conversion body and defining a connection region as the area that is under the wiring member and over the solar cell; wherein
the connecting wire has a fine-lined shape with a line width that is less than one third of the line width of the wiring member and has a main axis in the connection region and has a protruding portion having a width that is narrower than the wiring member width and protrudes from one side of the connection region to an opposite side of the connection region in the main surface to which the wiring member is connected, wherein
two straight protruding portions of the connecting wire meet to form an apex repeatedly on alternate sides of the connection region in a zig-zag pattern.

15. A solar cell module according to claim 14, wherein each connecting wire protruding wire portion has a width that is narrower than the wiring member.

16. A solar cell module according to claim 14, wherein the wiring member is disposed on the connection region through a tape-shaped or paste-like resin adhesive.

17. A solar cell module according to claim 16, wherein the wiring member is disposed through a tape-shaped resin adhesive.

18. A solar cell having a wiring member for connection to another solar cell, the solar cell comprising:
 a photoelectric conversion body;
 a plurality of fine-line electrodes formed as printed lines of conductive material on a main surface of the photoelectric conversion body;
 a connecting wire formed as printed conductive material over and crossing the fine line electrodes on the main surface of the photoelectric conversion body; and
 a wiring member formed over the connecting wire and the fine-line electrodes and defining a connection region as the area that is under the wiring member and over the solar cell and which is electrically connected to the connecting wire and the fine-line electrodes, wherein
the connecting wire has straight wire portions protruding from the connection region having widths that are narrower than the wiring member width and protrude neither perpendicular nor parallel alternately on both sides of the connection region in the main surface and wherein
two straight portions of the connecting wire that are neither perpendicular nor parallel meet to form an apex repeatedly on alternate sides of the connection region in a zig-zag pattern.

19. A solar cell according to claim 18, wherein the formed apexes are located on the fine-line electrodes.

20. A solar cell according to claim 18, wherein each connecting wire protruding wire portion has a width that is narrower than the wiring member.

21. A solar cell according to claim 18, wherein the wiring member is disposed through a tape-shaped or paste-like resin adhesive.

22. A solar cell according to claim 21, wherein the wiring member is disposed through a tape-shaped resin adhesive.

23. A solar cell configured for connection to another solar cell through a wiring member, the solar cell comprising:
 a photoelectric conversion body;
 a plurality of fine-line electrodes formed as printed lines of conductive material on a main surface of the photoelectric conversion body;
 a connecting wire formed as printed lines of conductive material over the fine-line electrodes on the main surface of the photoelectric conversion body and connected to the fine-line electrodes, and
 a wiring member formed over and electrically connected to both the connecting wire and the fine-line electrodes and defining a connection region as the area that is under the wiring member and over the solar cell,
wherein the connecting wire has a straight, oblique protruding wire portion that has a width that is narrower than the wiring member width and protrudes from the connection region to one side of the connecting region in the main surface to which the wiring member is connected, and
the protruding portion protrudes in an orthogonal direction neither perpendicular nor parallel to a longitudinal direction of the wiring member to the other side of the connection region wherein
two straight portions of the connecting wire meet repeatedly to form junctions on alternate sides of the connection region and are bisected at these junctions with fine line electrodes.

* * * * *